United States Patent
Naito et al.

(10) Patent No.: US 11,569,429 B2
(45) Date of Patent: Jan. 31, 2023

(54) LIQUID DISCHARGE HEAD

(71) Applicant: Brother Kogyo Kabushiki Kaisha, Nagoya (JP)

(72) Inventors: Kyohei Naito, Nagoya (JP); Takashi Aiba, Nagoya (JP); Keiji Kura, Chita (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 1100 days.

(21) Appl. No.: 16/144,052

(22) Filed: Sep. 27, 2018

(65) Prior Publication Data

US 2019/0103544 A1    Apr. 4, 2019

(30) Foreign Application Priority Data

Sep. 29, 2017   (JP) .............................. JP2017-192134

(51) Int. Cl.
*H01L 41/047* (2006.01)
*B41J 2/14* (2006.01)
(Continued)

(52) U.S. Cl.
CPC ........ *H01L 41/047* (2013.01); *B41J 2/14209* (2013.01); *B41J 2/14233* (2013.01); *H01L 41/0471* (2013.01); *H01L 41/083* (2013.01); *H01L 41/0973* (2013.01); *B41J 2002/14217* (2013.01); *B41J 2002/14266* (2013.01); (Continued)

(58) Field of Classification Search
None
See application file for complete search history.

(56) References Cited

U.S. PATENT DOCUMENTS

| 7,157,837 B2 | 1/2007 | Kojima |
| 7,192,124 B2 | 3/2007 | Kojima |

(Continued)

FOREIGN PATENT DOCUMENTS

| JP | 2004-259865 A | 9/2004 |
| JP | 2004-268325 A | 9/2004 |

(Continued)

OTHER PUBLICATIONS

Aug. 24, 2021—(JP) Notice of Reasons for Refusal—App 2017-192134.

(Continued)

*Primary Examiner* — Erica S Lin
(74) *Attorney, Agent, or Firm* — Banner & Witcoff, Ltd.

(57) ABSTRACT

S1 is a sum of the areas of a plurality of individual electrodes formed on a first plane of a piezoelectric body of a liquid discharge head, S2 is an area of a first common electrode formed on a second plane, S3 is an area of a second common electrode formed on a third plane, D1 is a distance between a neutral plane and the first plane in a stacking direction, D2 is the distance between the neutral plane and the second plane in the stacking direction, and D3 is the distance between the neutral plane and the third plane in the stacking direction. Then, $D1 \times S1 + D2 \times S2 > D3 \times S3$ is satisfied. The liquid discharge head includes a plurality of conductor layers which are formed on the third plane, without contact with the second common electrode and without contact with each other.

17 Claims, 13 Drawing Sheets

(51) Int. Cl.
*H01L 41/083* (2006.01)
*H01L 41/09* (2006.01)

(52) U.S. Cl.
CPC ............. *B41J 2002/14306* (2013.01); *B41J 2002/14459* (2013.01); *B41J 2002/14491* (2013.01)

(56) References Cited

U.S. PATENT DOCUMENTS

| | | |
|---|---|---|
| 2004/0164651 A1 | 8/2004 | Kojima |
| 2004/0174415 A1 | 9/2004 | Kojima |
| 2011/0074885 A1* | 3/2011 | Usui .................... B41J 2/14233 347/50 |
| 2015/0102835 A1 | 4/2015 | Huygens et al. |
| 2015/0137664 A1 | 5/2015 | Caris et al. |
| 2019/0103544 A1 | 4/2019 | Naito et al. |

FOREIGN PATENT DOCUMENTS

| | | |
|---|---|---|
| JP | 2005-288916 A | 10/2005 |
| JP | 2010-069618 A | 4/2010 |
| JP | 2011-206929 A | 10/2011 |
| JP | 2012-124195 A | 6/2012 |
| JP | 2019-064156 A | 4/2019 |

OTHER PUBLICATIONS

Aug. 3, 2021—(JP) Notice of Reasons for Refusal—App 2017-192136, Eng Tran.
May 2, 2022—U.S. Non-final Office Action—U.S. Appl. No. 16/144,182.
Aug. 31, 2022—U.S. Notice of Allowance—U.S. Appl. No. 16/144,182.

\* cited by examiner

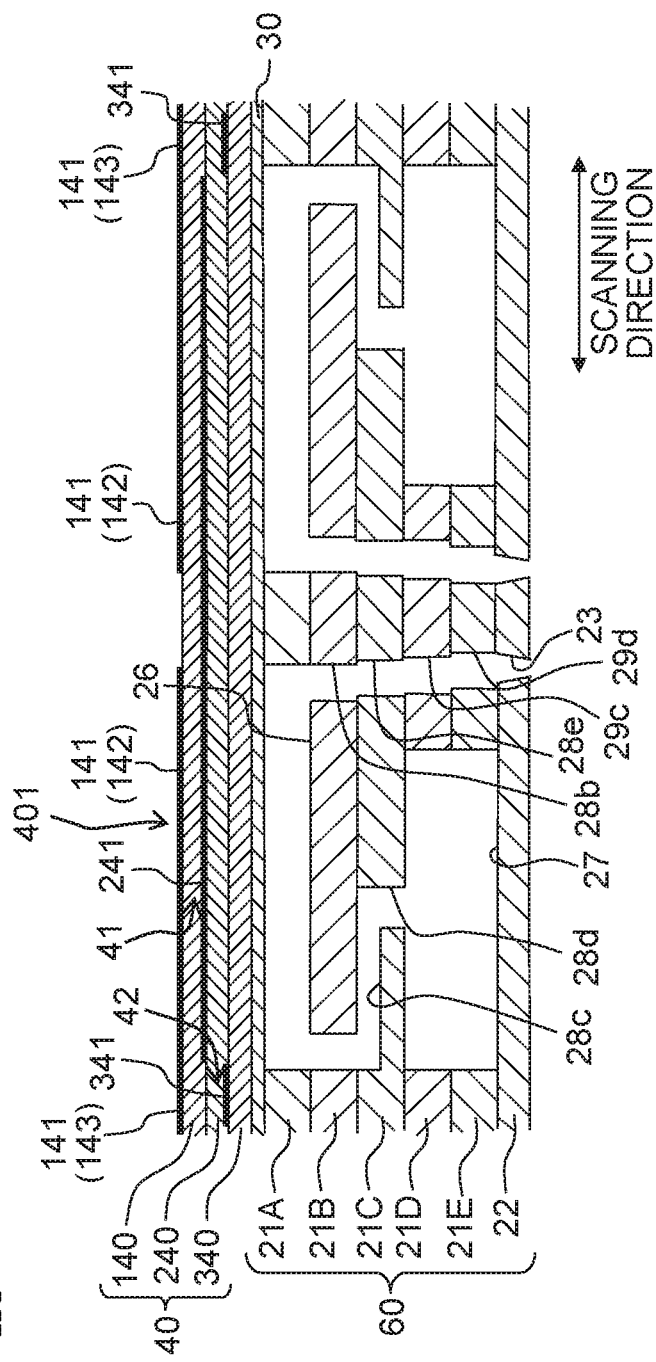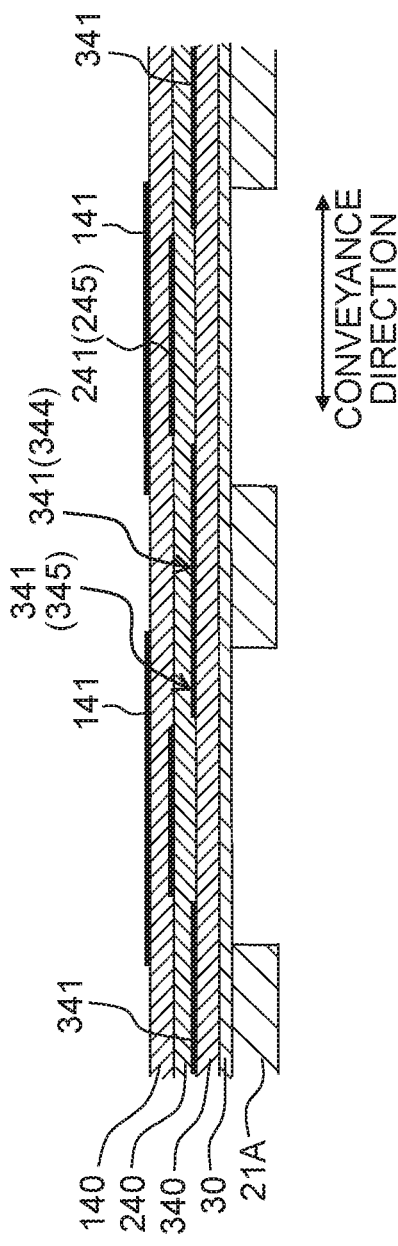

IXB-IXB LINE CROSS SECTION

IXC-IXC LINE CROSS SECTION

XB-XB LINE CROSS SECTION

XC-XC LINE CROSS SECTION

XIB-XIB LINE CROSS SECTION

XIC-XIC LINE CROSS SECTION

XIIB-XIIB LINE CROSS SECTION

XIIC-XIIC LINE CROSS SECTION 245 244
CONVEYANCE DIRECTION

SCANNING DIRECTION

SCANNING DIRECTION

LIQUID DISCHARGE HEAD

CROSS REFERENCE TO RELATED APPLICATION

The present application claims priority from Japanese Patent Application No. 2017-192134, filed on Sep. 29, 2017, the disclosure of which is incorporated herein by reference in its entirety.

BACKGROUND

Field of the Invention

The present disclosure relates to liquid discharge heads discharging liquid such as ink or the like toward a medium.

Description of the Related Art

There are known liquid discharge heads as the liquid discharge apparatus for an ink jet printer to form image by jetting ink onto a recording medium while moving relative to the recording medium. For example, there is known an ink jet printer having an ink jet head having a piezoelectric body where a plurality of piezoelectric material layers (ceramics sheets) are stacked.

SUMMARY

In the ink discharge head publicly known, there is known such a case that a warpage deformation occurs in the piezoelectric material layers when the piezoelectric material layers are calcined, due to the formation of a plurality of electrode arrays in the piezoelectric material layers. In order to lessen the warpage deformation occurring in the piezoelectric body, dummy electrodes may be formed on a surface of the piezoelectric material layers.

An object of the present disclosure is to lessen the warpage deformation occurring in the piezoelectric body of a liquid discharge head.

According to an aspect of the present disclosure, there is provided a liquid discharge head including: a piezoelectric body including a plurality of stacked piezoelectric layers having a first end and a second end separated in a first direction orthogonal to a stacking direction of the plurality of piezoelectric layers; a plurality of individual electrodes located at a first plane orthogonal to the stacking direction; a first common electrode located at a second plane which is orthogonal to the stacking direction and different in position in the stacking direction from the first plane and different in position in the stacking direction from a neutral plane of the piezoelectric body; and a second common electrode located at a third plane which is orthogonal to the stacking direction and different in position in the stacking direction from the first plane and different in position in the stacking direction from the neutral plane of the piezoelectric body. The neutral plane is positioned between the third plane and one of the first and second planes in the stacking direction. A relation of "$D1 \times S1 + D2 \times S2 > D3 \times S3$" is satisfied, where S1 is a sum of the areas of the plurality of individual electrodes, S2 is an area of the first common electrode, S3 is an area of the second common electrode, D1 is a distance between the neutral plane and the first plane in the stacking direction, D2 is a distance between the neutral plane and the second plane in the stacking direction, and D3 is a distance between the neutral plane and the third plane in the stacking direction. The plurality of individual electrodes include a plurality of individual electrode arrays arranged at intervals between the first end and the second end. The plurality of individual electrode arrays include a first individual electrode array, a second individual electrode array adjacent to the first individual electrode array in the first direction, a third individual electrode array adjacent to the second individual electrode array in the first direction, and a fourth individual electrode array adjacent to the third individual electrode array in the first direction. The first individual electrode array is positioned between the first end and the second individual electrode array in the first direction, the second individual electrode array is positioned between the first individual electrode array and the third individual electrode array in the first direction, and the third individual electrode array is positioned between the second individual electrode array and the fourth individual electrode array in the first direction. The plurality of individual electrodes forming the first individual electrode array are arranged in a second direction being orthogonal to the stacking direction and intersecting the first direction, the plurality of individual electrodes forming the second individual electrode array are arranged in the second direction, the plurality of individual electrodes forming the third individual electrode array are arranged along the second direction, and the plurality of individual electrodes forming the fourth individual electrode array are arranged in the second direction. The second common electrode includes a first extending portion extending in the second direction to pass through between the first individual electrode array and the second individual electrode array in the first direction, a plurality of first projecting portions projecting from the first extending portion toward the second end, a second extending portion extending in the second direction to pass through between the third individual electrode array and the fourth individual electrode array along the first direction, and a plurality of second projecting portions projecting from the second extending portion toward the first end. The respective first projecting portions overlap partially with one of the plurality of individual electrodes forming the second individual electrode array in the stacking direction, and the respective second projecting portions overlap partially with one of the plurality of individual electrodes forming the third individual electrode array in the stacking direction. The liquid discharge head further includes a plurality of conductor layers which are formed on the third plane between the plurality of first projecting portions and the plurality of second projecting portions in the first direction, without contact with the second common electrode and without contact with each other.

According to the above configuration, when S1 is the sum of the areas of the plurality of individual electrodes, S2 is the area of the first common electrode, S3 is the area of the second common electrode, D1 is the distance between the neutral plane and the first plane along the stacking direction, D2 is the distance between the neutral plane and the second plane along the stacking direction, and D3 is the distance between the neutral plane and the third plane in the stacking direction, then $D1 \times S1 + D2 \times S2 > D3 \times S3$ holds. Therefore, the piezoelectric body deforms to undergo a large warpage, projecting toward the second common electrode. With respect to that, because a plurality of conductor layers are formed on the third plane, by increasing the magnitude of the left side of the above relational expression, it is possible to reduce the difference in magnitude between the left side and the right side. By virtue of this, it is possible to lessen the large warpage deformation occurring in the piezoelectric body.

BRIEF DESCRIPTION OF THE DRAWINGS

FIGS. 4A and 4B are schematic cross-sectional views of the ink discharge head, wherein FIG. 4A is a schematic cross-sectional view along a scanning direction whereas FIG. 4B is a schematic cross-sectional view along a conveyance direction;

DESCRIPTION OF THE EMBODIMENT

<Overall Configuration of Printer>

Figure 1:
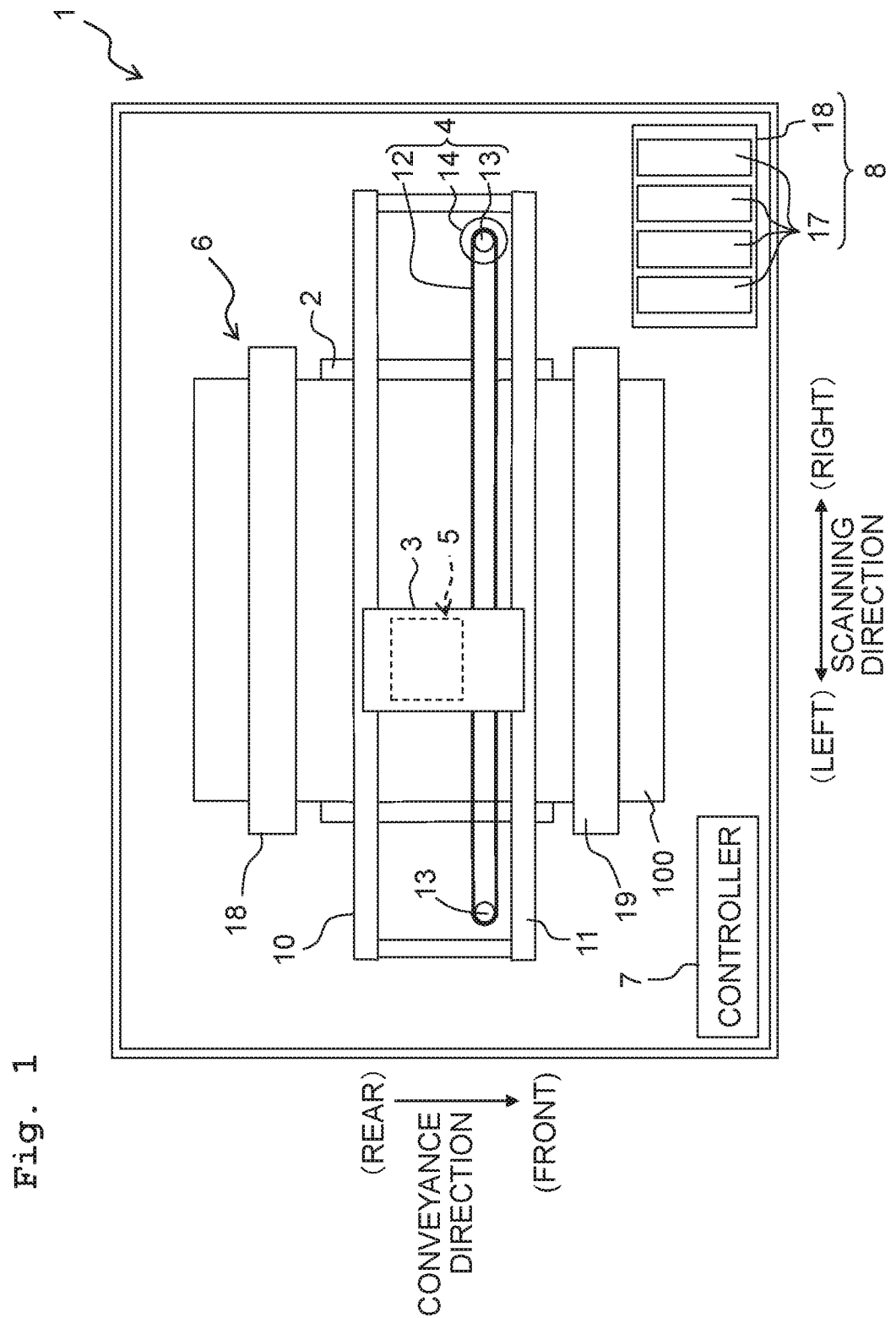
FIG. 1 is a plan view schematically showing an ink jet printer 1.

A preferred embodiment of the present invention will be explained below. As depicted in FIG. 1, an ink jet printer 1 includes a platen 2, a carriage 3, a carriage driving mechanism 4, an ink jet head 5, a conveyance mechanism 6, a controller 7, and an ink supply unit 8.

Recording paper 100, that is, a recording medium, is carried on the upper surface of the platen 2. The carriage 3 is configured to reciprocatingly move in a left/right direction (also to be referred to below as a scanning direction) along two guide rails 10 and 11 in an area facing the platen 2, caused by the carriage driving mechanism 4. The carriage driving mechanism 4 includes a belt 12, a carriage driving motor 14, and two rollers 13 arranged at the opposite sides of the platen 2 along the scanning direction to interpose the platen 2 therebetween. The carriage 3 is linked with the belt 12. The belt 12 is stretched on and across the two rollers 13 arranged apart in the scanning direction, to form, as viewed from above, an elliptic ring elongated in the scanning direction. As depicted in FIG. 1, the right roller 13 is linked to the rotary shaft of the carriage driving motor 14. By rotating the carriage driving motor 14, it is possible to move the belt 12 around the two rollers 13. Along with this, it is possible to reciprocatingly move the carriage 3 linked with the belt 12 along the scanning direction.

The ink jet head 5 is fitted on the carriage 3 to move reciprocatingly in the scanning direction together with the carriage 3. The ink supply unit 8 includes four ink cartridges 17 respectively retaining inks of four colors (black, yellow, cyan, and magenta), a cartridges holder 18 in which the four ink cartridges 17 are installed, and tubes which are not depicted. The ink jet head 5 is connected with the four ink cartridges 17 through the undepicted tubes. By virtue of this, the four color inks are supplied to the ink jet head 5 from the ink supply unit 8.

The ink jet head 5 is formed with a plurality of nozzles 23 in its lower surface (the surface on the far side of the page of FIG. 1). The plurality of nozzles 23 jet the inks supplied from the ink cartridges 17 toward the recording paper 100 carried on the platen 2.

The conveyance mechanism 6 has two conveyance rollers 18 and 19 arranged to interpose the platen 2 along a front/rear direction. The conveyance mechanism 6 conveys the recording paper 100 on the platen 2 frontward (also to be referred to below as a conveyance direction), by using the two conveyance rollers 18 and 19.

The controller 7 includes a ROM (Read Only Memory), a RAM (Random Access Memory), an ASIC (Application Specific Integrated Circuit) including a control circuit, and the like. The controller 7 causes the ASIC to carry out various processes such as printing on the recording paper 100 and the like according to computer programs stored in the ROM. For example, in a printing process, the controller 7 controls the ink jet head 5, the carriage driving motor 14 and the like to print image on the recording paper 100, based on a print command inputted from an external device such as a PC or the like. In particular, the controller 7 alternately carries out an ink jet operation to jet the inks while moving the ink jet head 5 in the scanning direction together with the carriage 3, and a conveyance operation to let the conveyance rollers 18 and 19 convey the recording paper 100 through a predetermined distance in the conveyance direction.

Figure 2:
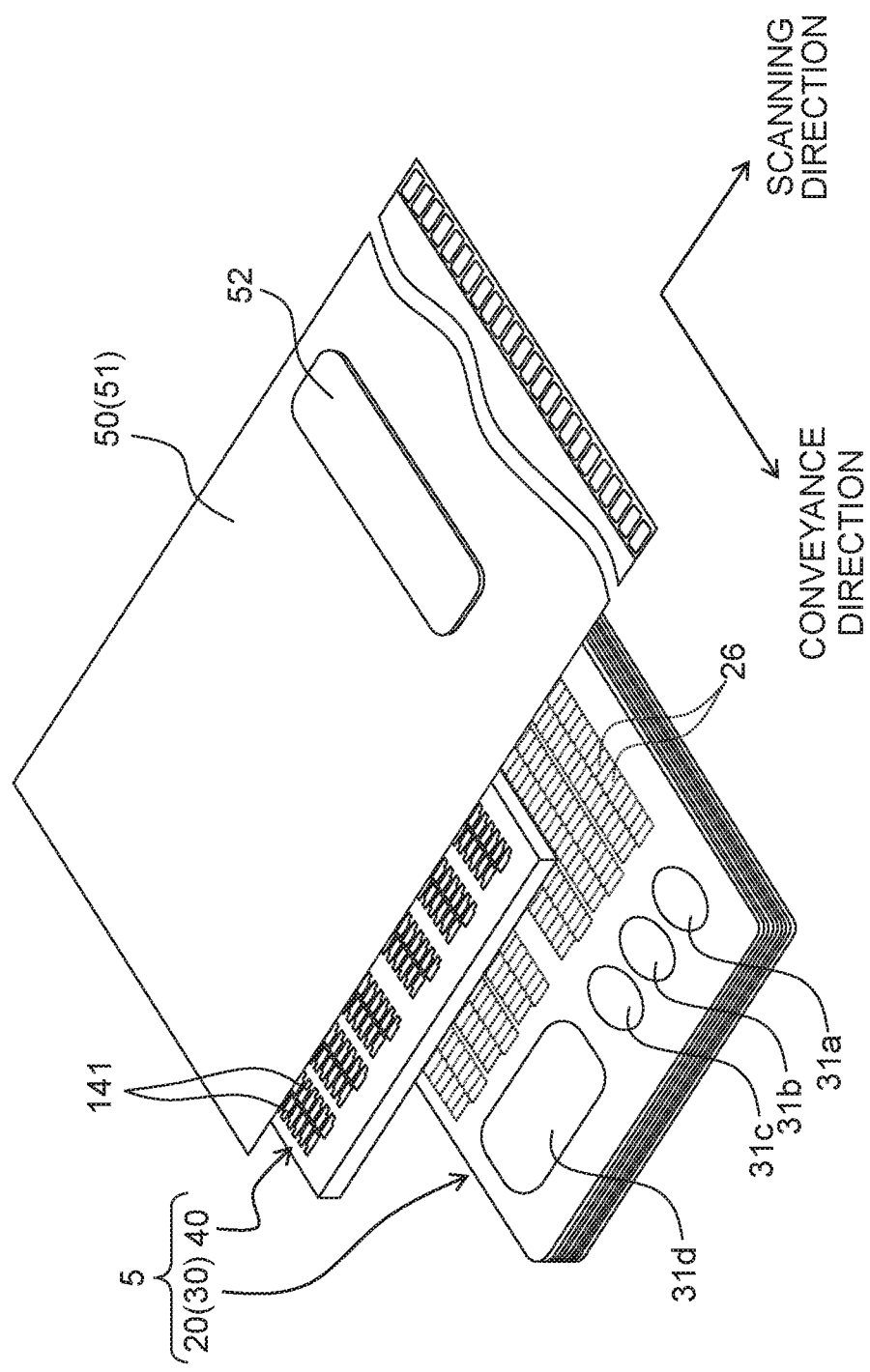
FIG. 2 is a schematic view of an ink jet head 5 and a wiring member 50 according to the embodiment.
Figure 3:
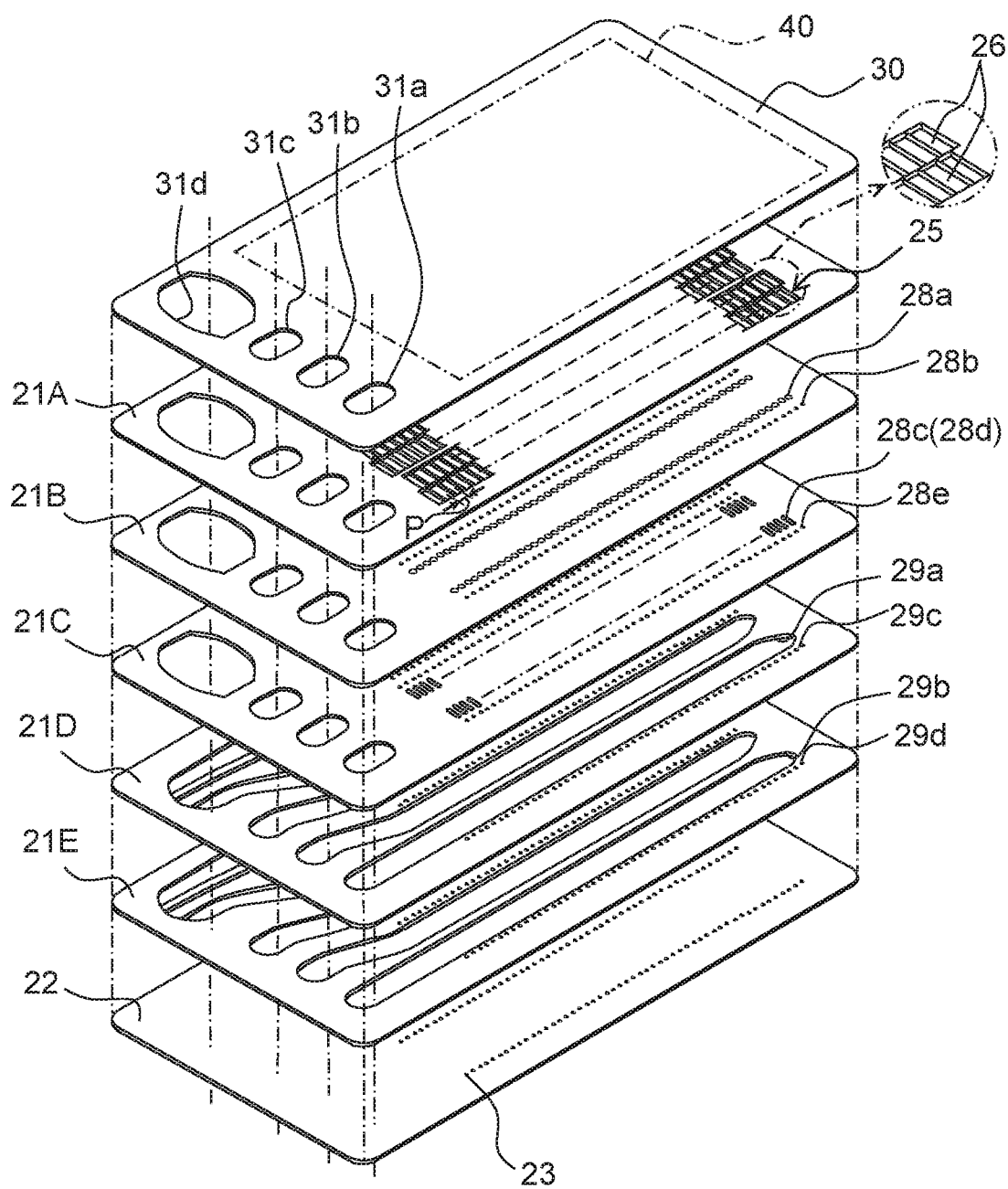
FIG. 3 is a schematic exploded view of a layered body.

The ink jet head 5 primarily includes a flow channel unit 20, a vibration plate 30, a piezoelectric body 40, and a wiring member 50 (see FIG. 2). As depicted in FIGS. 2 and 3, the flow channel unit 20 includes a nozzle plate 22 and five metallic plates 21A to 21E. Further, the vibration plate 30 is joined onto the metallic plate 21A of the flow channel unit 20. In the following explanation, the combination of the flow channel unit 20 and the vibration plate 30 will be referred to as a layered body 60. That is, the layered body 60 is, as depicted in FIG. 3, a member which has the vibration plate 30, the five metallic plates 21A to 21E and the nozzle plate 22, and stacks those plates in the above order to join the same together. In the following explanation, the direction of stacking those plates in the layered body 60 will be referred to as a stacking direction.

The vibration plate 30 is a metallic plate of an approximately rectangular shape elongated in the conveyance direction. Note that the metallic plates 21A to 21E and the nozzle plate 22 are also approximately rectangular plates having the same planar shape. As depicted in FIGS. 2 and 3, in an end portion of the vibration plate 30 along the conveyance direction, four openings 31a to 31d are formed as ink supply ports for supplying the inks to aftermentioned manifolds. The four openings 31a to 31d are arranged to align in the scanning direction (the left/right direction). The opening 31a is the ink supply port for the yellow ink, the opening 31b is the ink supply port for the magenta ink, the opening 31c is the ink supply port for the cyan ink, and the opening 31d is the ink supply port for the black ink. There are three manifolds for the black ink, and the opening 31d is the supply port for supplying the black ink to the three manifolds. On the other hand, there is one manifold of each of the color inks (each of the cyan, magenta and yellow inks), and the openings 31*a* to 31*c* are supply ports for supplying one color ink to one manifold respectively. Therefore, the opening 31*d* has a larger area than the area of each of the openings 31*a* to 31*c*.

The plate 21A is a metallic plate with regularly formed openings which function as a plurality of pressure chambers 26. Further, other openings are formed respectively in positions overlapping with the four openings 31*a* to 31*d* of the vibration plate 30. The plurality of pressure chambers 26 form pressure chamber rows 25 arrayed in the conveyance direction at an arrayal pitch P such that twelve such pressure chamber rows 25 are formed. The twelve pressure chamber rows 25 are arranged to align in the scanning direction (the left/right direction).

Among the twelve pressure chamber rows 25, six pressure chamber rows 25 are used for the color inks, while the other six pressure chamber rows 25 are used for the black ink. As depicted in FIG. 2, the six pressure chamber rows 25 for the black ink are provided to align with the opening 31*d* along the conveyance direction. The six pressure chamber rows 25 for the color inks have two pressure chamber rows 25 for the cyan ink, two pressure chamber rows 25 for the magenta ink, and two pressure chamber rows 25 for the yellow ink. The two pressure chamber rows 25 for the cyan ink are provided to align with the opening 31*c* along the conveyance direction. The two pressure chamber rows 25 for the magenta ink are provided to align with the opening 31*b* along the conveyance direction. The two pressure chamber rows 25 for the yellow ink are provided to align with the opening 31*a* along the conveyance direction.

Between the two pressure chamber rows 25 for the cyan ink, the pressure chambers 26 deviate in position along the conveyance direction by half of the arrayal pitch P (P/2) of the respective pressure chamber rows 25. Much the same is true on the two pressure chamber rows 25 for the magenta ink, and on the two pressure chamber rows 25 for the yellow ink. The six pressure chamber rows 25 for the black ink have three sets of two pressure chamber rows 25 (three pairs of pressure chamber rows 25) where the pressure chambers 26 deviate in position along the conveyance direction by half of the arrayal pitch P (P/2) of the respective pressure chamber rows 25. Note that although there is no explicit illustration in FIG. 2, the three pairs of pressure chamber rows 25 are arranged to deviate respectively from each other along the conveyance direction by ⅓ of the arrayal pitch P. Therefore, as a whole, in the six pressure chamber rows 25, the pressure chambers 26 deviate from each other in position along the conveyance direction by ⅙ of the arrayal pitch P of the respective pressure chamber rows 25.

The plate 21B is formed therein with communication holes 28*a* which form flow channels laid from aftermentioned manifolds 27 (common ink chambers) to the respective pressure chambers 26, and communication holes 28*b* which form flow channels laid from the respective pressure chambers 26 to aftermentioned respective nozzles 23. In the upper surface of the plate 21C, communication holes 28*c* are formed as recesses for communications between the pressure chambers 26 and the manifolds 27. Further, the plate 21C is formed therein with, respectively, communication holes 28*d* which form flow channels laid from the manifolds 27 to the pressure chambers 26, and communication holes 28*e* which form flow channels laid from the pressure chambers 26 to the nozzles 23. Further, openings are formed respectively in such positions of the plates 21B and 21C as to overlap with the four openings 31*a* to 31*d* of the vibration plate 30. The plates 21D and 21E are formed with, respectively, communication holes 29*a* and 29*b* forming the manifolds 27 and, furthermore, communication holes 29*c* and 29*d* forming flow channels laid from the pressure chambers 26 to the nozzles 23.

The nozzle plate 22 is made of a synthetic resin (for example, polyimide resin) where the nozzles 23 are formed to correspond to the pressure chambers 26 formed in the plate 21A.

By stacking and joining those vibration plate 30, metallic plates 21A to 21E and nozzle plate 22, as depicted in FIGS. 4A and 4B, a plurality of flow channels are formed from the manifolds to the nozzles 23 via the pressure chambers 26. At the same time, ink supply flow channels are also formed for supplying the inks to the manifolds 27.

Because the vibration plate 30 and the metallic plates 21A to 21E are metallic plates, it is possible to join the same by way of metallic diffusion junction. Further, because the nozzle plate 22 is made of resin, it is joined to the plate 21E with an adhesive or the like but not by metallic diffusion junction. Note that the nozzle plate 22 may be a metallic plate and, in such a case, it is possible to join the same with the other plates in the same manner as the other plates by way of metallic diffusion junction. Alternatively, all the plates may be joined with an adhesive or the like.

<The Piezoelectric Body 40>

As depicted in FIGS. 2 and 3, for example, the piezoelectric body 40 is arranged on the vibration plate 30. The piezoelectric body 40 has an approximately rectangular planar shape. As depicted in FIGS. 4A and 4B, the piezoelectric body 40 is formed with a plurality of piezoelectric elements 401. The plurality of piezoelectric elements 401 are provided to correspond respectively to the plurality of pressure chambers 26. Each of the piezoelectric elements 401 cooperates with the vibration plate 30 to change the volume of the corresponding pressure chamber 26. By virtue of this, each of the piezoelectric elements 401 cooperates with the vibration plate 30 to apply a pressure to the ink in the corresponding pressure chamber 26 so as to provide the ink with energy for jetting the ink from the nozzle 23 in communication with the corresponding pressure chamber 26.

Hereinbelow, a configuration of the piezoelectric body 40 will be explained. As depicted in FIGS. 4A and 4B, the piezoelectric body 40 has three piezoelectric layers (an upper piezoelectric layer 140, an intermediate piezoelectric layer 240, and a lower piezoelectric layer 340), individual electrodes (upper electrodes) 141, an intermediate common electrode (intermediate electrode) 241, and a lower common electrode (lower electrode) 341. The lower piezoelectric layer 340, the intermediate piezoelectric layer 240 and the upper piezoelectric layer 140 are stacked on the vibration plate 30 in the above order. The three piezoelectric layers 140, 240, and 340 are formed of, for example, lead zirconate titanate (PZT) which is a mixed crystal of lead titanate and lead zirconate. Alternatively, three piezoelectric layers 140, 240, and 340 may be formed of a non-lead based piezoelectric material which does not contain lead. The lower common electrode 341 is arranged on the upper surface of the lower piezoelectric layer 340, the intermediate common electrode 241 is arranged on the upper surface of the intermediate piezoelectric layer 240, and the individual electrodes 141 are arranged on the upper surface of the upper piezoelectric layer 140.

In the following explanation, the two opposite ends of the upper piezoelectric layer 140 along the scanning direction will be referred to as an end portion 140L and an end portion 140R, while the two opposite ends along the conveyance direction will be referred to as an end portion 140U and an end portion 140D (see FIG. 5). The two opposite ends of the intermediate piezoelectric layer 240 along the scanning direction will be referred to as an end portion 240L and an end portion 240R, while the two opposite ends along the conveyance direction will be referred to as an end portion 240U and an end portion 240D (see FIG. 6). The two opposite ends of the lower piezoelectric layer 340 along the scanning direction will be referred to as an end portion 340L and an end portion 340R, while the two opposite ends along the conveyance direction will be referred to as an end portion 340U and an end portion 340D (see FIG. 7).

Figure 5:
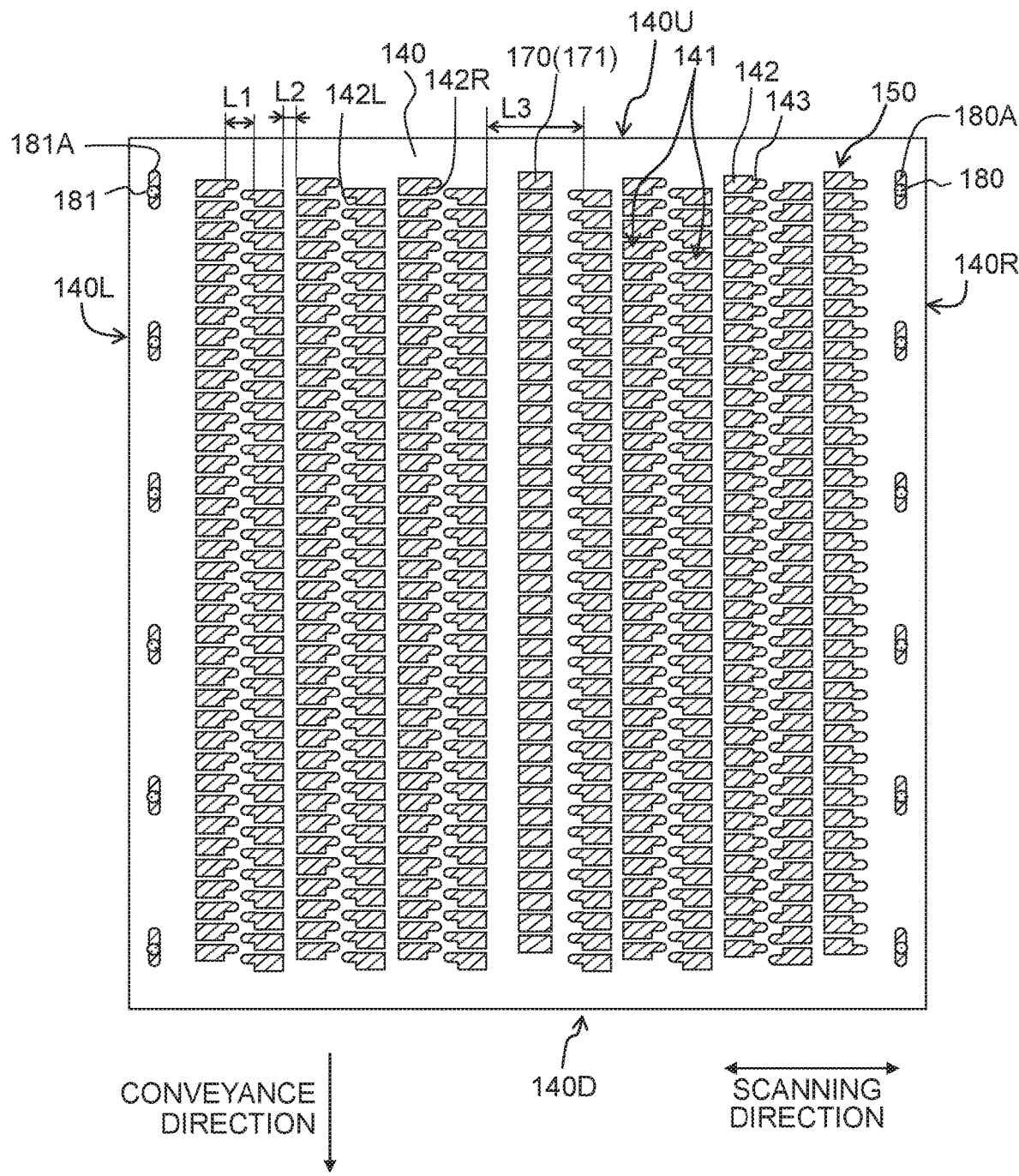
FIG. 5 is a top view of an upper piezoelectric layer 140.
Figure 6:
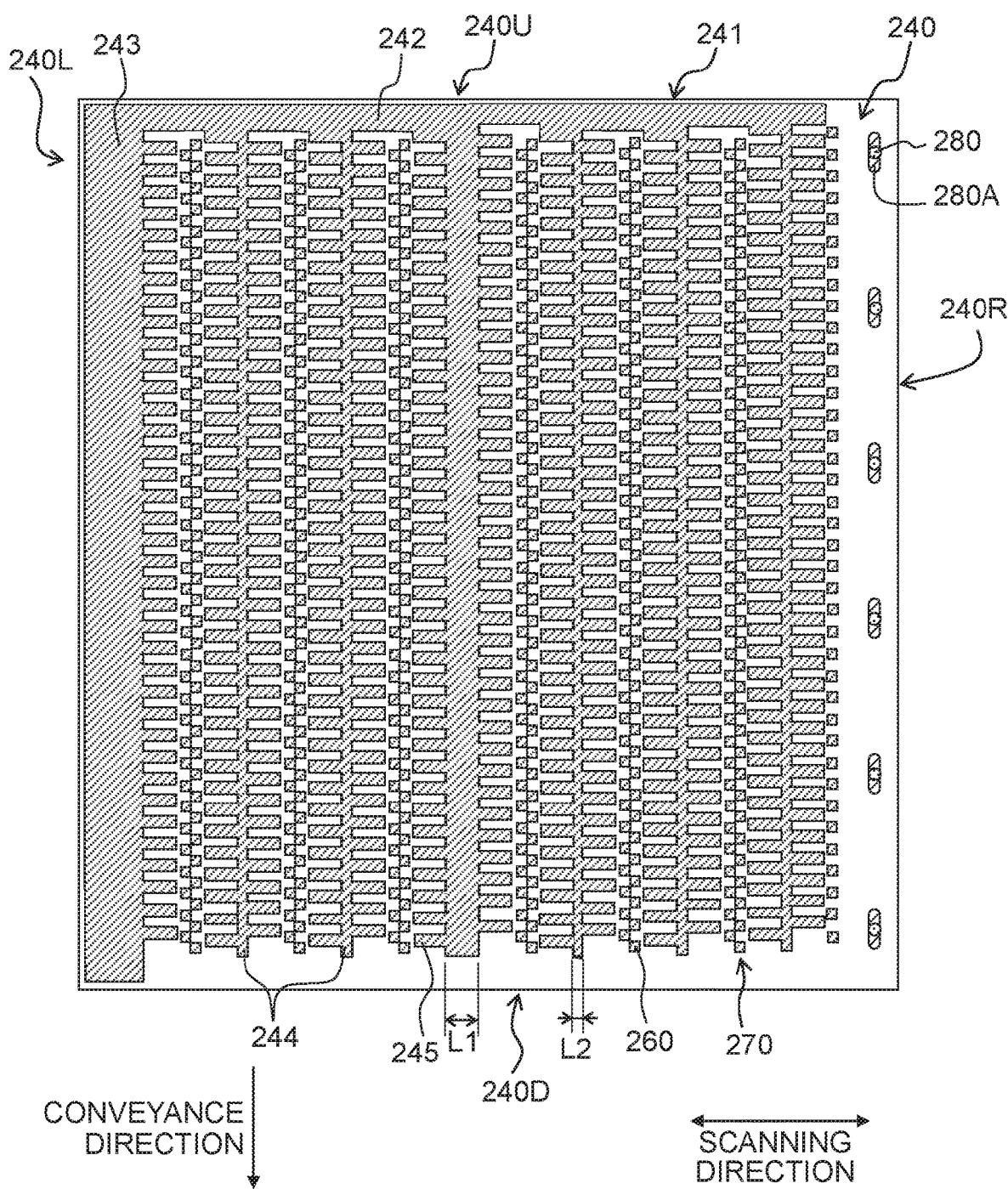
FIG. 6 is a top view of an intermediate piezoelectric layer 240.

As depicted in FIG. 5, in the end portion 140L of the upper piezoelectric layer 140 along the scanning direction, such six through holes 181 are formed as filled with a conductive substance such as a solder or the like, and the conductive substance in the through holes 181 are in conduction with the intermediate common electrode 241 (an aftermentioned extending portion 243 (see FIG. 6)) formed on the upper surface of the intermediate piezoelectric layer 240. Further, on the upper surface of the upper piezoelectric layer 140, terminals 181A are formed for conduction with the conductive substance in the through holes 181 such that it is possible to apply a predetermined potential (24 V, for example) to the intermediate common electrode 241 from a driver IC 52 via an aftermentioned FPC 51. In the same manner, in the end portion 140R of the upper piezoelectric layer 140 along the scanning direction, too, such six through holes 180 are formed as filled with a conductive substance such as a solder or the like. As depicted in FIG. 6, such six through holes 280 are formed as filled with a conductive substance such as a solder or the like, in positions overlapping with the six through holes 180 along the stacking direction. The conductive substance in the through holes 280 are in conduction with the lower common electrode 341 (an aftermentioned extending portion 343 (see FIG. 7)). Further, as depicted in FIG. 5, on the upper surface of the upper piezoelectric layer 140, terminals 180A are formed for conduction with the conductive substance in the through holes 180 such that it is possible to apply a predetermined potential (0 V, for example) to the lower common electrode 341 from the driver IC 52 via the aftermentioned FPC 51.

<The Individual Electrodes 141>

As depicted in FIGS. 4A and 4B, the plurality of individual electrodes 141 are formed in such positions of the upper surface of the upper piezoelectric layer 140 as to correspond respectively to the plurality of pressure chambers 26. The individual electrodes 141 are formed of, for example, platinum (Pt), iridium (Ir), or the like. As depicted in FIG. 5, twelve individual electrode arrays 150 are formed to correspond to the twelve pressure chamber rows 25. The twelve individual electrode arrays 150 align in the scanning direction. Each of the individual electrode arrays 150 includes 37 individual electrodes 141 aligned at a predetermined pitch P along the conveyance direction. Among the 12 individual electrode arrays 150, pairs of the individual electrode arrays 150 are formed respectively as follows when counted from the closest row to the end portion 140L of the upper piezoelectric layer 140 along the scanning direction (the left/right direction): the first and the second, the third and the fourth, the fifth and the sixth, the seventh and the eighth, the ninth and the tenth, the eleventh and the twelfth individual electrode arrays 150. Note that in the following explanation, along the scanning direction, simply the nth individual electrode array 150 from the left will be used to refer to the nth individual electrode array 150 when counted from the closest row to the end portion 140L of the upper piezoelectric layer 140 along the scanning direction. Much the same is true on the intermediate piezoelectric layer 240 and the lower piezoelectric layer 340, along the scanning direction, simply the nth individual electrode array 150 from the left will be used to refer to the nth individual electrode array 150 when counted from the closest row to the end portion 240L of the intermediate piezoelectric layer 240 (see FIG. 6), or to the nth individual electrode array 150 when counted from the closest row to the end portion 340L of the lower piezoelectric layer 340 (see FIG. 7). Between each pair of the individual electrode arrays 150, the individual electrodes 141 deviate in position along the conveyance direction by half of the arrayal pitch P (P/2) of the respective individual electrode arrays 150. Further, the pairs of the seventh and the eighth, the ninth and the tenth, the eleventh and the twelfth individual electrode arrays 150 from the left deviate respectively from each other by ⅓ of the arrayal pitch P along the conveyance direction. Therefore, in the pairs of the seventh and the eighth, the ninth and the tenth, the eleventh and the twelfth individual electrode arrays 150, the individual electrodes 141 deviate from each other in position along the conveyance direction by ⅙ of the arrayal pitch P of the respective individual electrode arrays 150.

Among the twelve individual electrode arrays 150, the pairs of the first and second, third and fourth, and fifth and sixth individual electrode arrays 150 from the left correspond respectively to the pressure chamber rows 25 for the cyan ink, the pressure chamber rows 25 for the magenta ink, and the pressure chamber rows 25 for the yellow ink. Further, the three pairs of the seventh and eighth, ninth and tenth, and eleventh and twelfth individual electrode arrays 150 from the left correspond to the pressure chamber rows 25 for the black ink.

Each of the individual electrodes 141 has a wide portion 142 (one example of the first part) having a rectangular planar shape, and a narrow portion 143 (one example of the second part) extending from the wide portion 142 in the left/right direction (the scanning direction) either to the left or to the right. Each of the narrow portions 143 is formed with an undepicted bump joined electrically with an undepicted contact point provided in the FPC 51 of an aftermentioned wiring member 50. As depicted in FIG. 5, in the individual electrodes 141 forming the first, third, fifth, eighth, tenth, and twelfth individual electrode arrays 150 from the left among the twelve individual electrode arrays 150, the narrow portions 143 extend in the scanning direction from end portions 142R of the wide portions 142 along the scanning direction toward the end portion 140R of the upper piezoelectric layer 140. In the individual electrodes 141 forming the second, fourth, sixth, seventh, ninth, tenth and eleventh individual electrode arrays 150 from the left among the twelve individual electrode arrays 150, the narrow portions 143 extend in the scanning direction from end portions 142L of the wide portions 142 along the scanning direction toward the end portion 140L of the upper piezoelectric layer 140. Note that the narrow portions 143 extend at the far side from the nozzles formed in the corresponding pressure chambers 26 along the scanning direction (see FIG. 4A). That is, in the pressure chambers 26 forming the first, third, fifth, eighth, tenth, and twelfth pressure chamber rows 25 from the left, the nozzles 23 of the respective pressure chambers 26 are formed in positions closer to the end portions 140L of the upper piezoelectric layer 140 than to the center along the scanning direction. In the pressure chambers 26 forming the second, fourth, sixth, seventh, ninth and eleventh pressure chamber rows 25 from the left, the nozzles 23 of the respective pressure chambers 26 are formed in positions closer to the end portions 140R of the upper piezoelectric layer 140 than to the center along the scanning direction.

Among the individual electrode arrays 150 adjacent to each other along the scanning direction, (1) the first individual electrode array 150 and the second individual electrode array 150 from the left; (2) the third individual electrode array 150 and the fourth individual electrode array 150 from the left; (3) the fifth individual electrode array 150 and the sixth individual electrode array 150 from the left; (4) the eighth individual electrode array 150 and the ninth individual electrode array 150 from the left; and (5) the tenth individual electrode array 150 and the eleventh individual electrode array 150 from the left, are arranged such that the narrow portions 143 of the individual electrodes 141 forming the individual electrode arrays 150 may respectively face each other along the scanning direction. Therefore, the interval (L1) along the scanning direction between the wide portions 142 of the individual electrodes 141 forming the two individual electrode arrays 150 is larger than the interval (L2) along the scanning direction of the wide portions 142 of the individual electrodes 141 forming the two individual electrode arrays 150 where the narrow portions 143 do not face each other along the scanning direction. Note that the interval (L3) along the scanning direction between the wide portions 142 of the individual electrodes 141 forming the sixth individual electrode array 150 and the seventh individual electrode array 150 from the left is larger than the interval L1 and the interval L2. This is because the first to the sixth individual electrode arrays 150 from the left correspond to the pressure chamber rows 25 for the color inks, while the seventh to the twelfth individual electrode arrays 150 from the left correspond to the pressure chamber rows 25 for the black ink.

Between the sixth individual electrode array 150 from the left and the seventh individual electrode array 150 from the left along the scanning direction, a dummy electrode array 170 is provided and formed from dummy electrodes 171 aligning at the same arrayal pitch P along the conveyance direction as for the individual electrodes 141. The dummy electrodes 171 are formed to correspond to the wide portions 142 of the individual electrodes 141, and have almost the same size and shape as the wide portions 142 of the individual electrodes 141. Note that because the driver IC 52 does not apply the potential to the dummy electrodes 171, no dummy electrodes 171 are provided in the parts corresponding to the narrow portions 143 of the individual electrodes 141. Both the interval between the wide portions 142 of the individual electrodes 141 forming the sixth individual electrode array 150 from the left and the dummy electrode 171 along the scanning direction, and the interval between the wide portions 142 of the individual electrodes 141 forming the seventh individual electrode array 150 from the left and the dummy electrode 171 along the scanning direction, are L1.

<The Intermediate Common Electrode 241>

As depicted in FIGS. 4A and 4B, the intermediate common electrode 241 is formed on the upper surface of the intermediate piezoelectric layer 240. As depicted in FIG. 6, the intermediate common electrode 241 has an extending portion 242 extending in the scanning direction (the left/right direction) to cover an end portion 240U of the intermediate piezoelectric layer 240 along the conveyance direction, an extending portion 243 extending in the conveyance direction to cover the end portion 240L of the intermediate piezoelectric layer 240 along the scanning direction, six extending portions 244 extending in the conveyance direction from the extending portion 242 toward an end portion 240D of the intermediate piezoelectric layer 240 along the conveyance direction, and a plurality of projecting portions 245 projecting from the respective extending portions 244 to the two opposite sides along the scanning direction. Further, the plurality of projecting portions 245 also project from the extending portion 243 toward the end portion 240R of the intermediate piezoelectric layer 240.

Figure 8A:
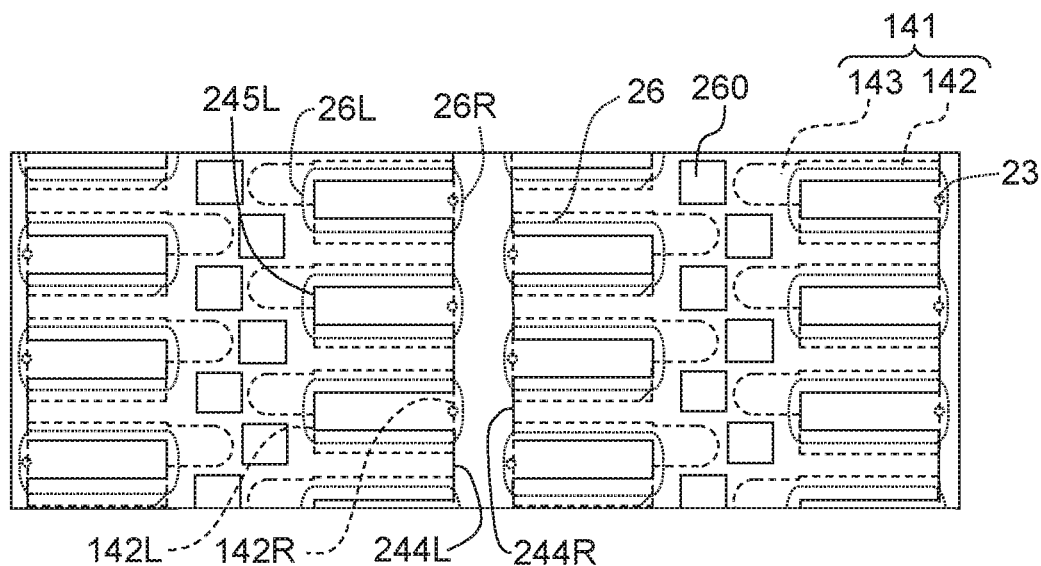
FIG. 8A is a schematic view showing an overlap between the upper piezoelectric layer 140 and the intermediate piezoelectric layer 240.

The extending portion 242 and the extending portion 243 are positioned not to overlap with the pressure chambers 26 and the individual electrodes 141 along the stacking direction. As depicted in FIG. 8A, the extending portions 244 extend along the conveyance direction between the wide portions 142 of the individual electrodes 141 forming two adjacent individual electrode arrays 150 along the scanning direction, so as not to overlap with the wide portions 142 of the individual electrodes 141 forming the individual electrode arrays 150 along the stacking direction. In FIG. 6, among the six extending portions 244, the first extending portion 244 from the left extends along the conveyance direction to pass through between, along the scanning direction, the wide portions 142 forming the second and third individual electrode arrays 150 from the left. The second extending portion 244 from the left extends along the conveyance direction to pass through between, along the scanning direction, the wide portions 142 forming the fourth and sixth individual electrode arrays 150 from the left. The third extending portion 244 from the left extends along the conveyance direction to pass through between, along the scanning direction, the wide portions 142 forming the sixth individual electrode array 150 from the left and the dummy electrodes 171 forming the dummy electrode array 170. The fourth extending portion 244 from the left extends along the conveyance direction to pass through between, along the scanning direction, the wide portions 142 forming the seventh and eighth individual electrode arrays 150 from the left. The fifth extending portion 244 from the left extends along the conveyance direction to pass through between, along the scanning direction, the wide portions 142 forming the ninth and tenth individual electrode arrays 150 from the left. The sixth extending portion 244 from the left extends along the conveyance direction to pass through between, along the scanning direction, the wide portions 142 forming the eleventh and twelfth individual electrode arrays 150 from the left.

The third extending portion 244 from the left is positioned at the boundary between the pressure chamber rows 25 for the color inks and the pressure chamber rows 25 for the black ink, being wider than the other extending portions 244 in accordance with the wider interval between the pressure chamber rows 25 along the scanning direction as described earlier on. The other five extending portions 244 have the same width. Note that with respect to the five extending portions 244 not including the third extending portions 244 from the left, the individual electrodes 141 forming the two individual electrode arrays 150 interposing each extending portion 244 along the scanning direction are arranged to let the narrow portions 143 extend to the opposite side along the scanning direction. That is, with respect to the five extending portions 244 not including the third extending portion 244 from the left, the interval of the wide portions 142 of the individual electrodes 141 along the scanning direction is L2, those individual electrodes 141 forming the two individual electrode arrays 150 interposing each extending portion 244 along the scanning direction. In accordance with that, the width, along the scanning direction, of the five extending portions 244 not including the third extending portion 244 from the left, is also L2.

Next, referring to FIG. 8A, an explanation will be made about a positional relation between the pressure chambers 26, the individual electrodes 141, and the intermediate common electrode 241. In FIG. 8A, the four individual electrode arrays aligning in the scanning direction are depicted but, here with FIG. 8A, the explanation will be made about the positional relation by taking as an example the individual electrodes 141 included in the second individual electrode array from the left, and the pressure chambers 26 and intermediate common electrode 241 overlapping therewith along the stacking direction. In order to see the figure easily, solid lines are used to show the intermediate common electrode 241 and the conductive layers 260 formed in the intermediate piezoelectric layer 240, while dotted lines are used to show the pressure chambers 26, the individual electrodes 141, and the like.

The pressure chambers 26 are longer than the wide portions 142 of the individual electrodes 141, along the scanning direction. Note that the entire length, along the scanning direction, of the individual electrodes 141 including the wide portions 142 and the narrow portions 143 is larger than the pressure chambers 26 along the scanning direction. The projecting portions 245 of the intermediate common electrode 241 are almost as long as the wide portions 142 of the individual electrodes 141, along the scanning direction.

The nozzles 23 are positioned closer to the end portions 26R than to the end portions 26L of the pressure chambers along the scanning direction. The end portions 26R of the pressure chambers 26 are positioned between the end portions 244L and the end portions 244L of the extending portions 244 along the scanning direction. The end portions 26L of the pressure chambers 26 are positioned between the end portions 142L of the wide portions 142 and the end portions 143L of the narrow portions 143 along the scanning direction. The end portions 245L of the projecting portions 245 of the intermediate common electrode 241 along the scanning direction have almost the same position as the end portions 142L of the wide portions 142 along the scanning direction. The end portions 141R of the wide portions 142 of the individual electrodes 141, the end portions 244 of the extending portions 244, and the nozzles 23 have almost the same position, along the scanning direction.

Between the projecting portions 245 of the intermediate common electrode 241, the pressure chambers 26, and the wide portions 142 of the individual electrodes 141, the central positions thereof along the conveyance direction are almost in alignment with each other along the conveyance direction. The pressure chambers 26 are longer than the projecting portions 245 of the intermediate common electrode 241 along the conveyance direction, and the ratio between their lengths is 2:1 or so. Therefore, two opposite end parts of the pressure chambers 26 along the conveyance direction (about ¼ of the length of the pressure chambers 26 along the conveyance direction) do not overlap with the projecting portions 245 of the intermediate common electrode 241 along the stacking direction. Further, the wide portions 142 of the individual electrodes 141 are longer than the pressure chambers 26, along the conveyance direction.

<The Conductive Layers 260>

As depicted in FIG. 6, between the plurality of projecting portions 245 projecting in the scanning direction from the first extending portion 244 from the left toward the end portions 240R, and the plurality of projecting portions 245 projecting in the scanning direction from the second extending portion 244 from the left toward the end portions 240L, two conductive layer rows 270 are arranged to extend in the conveyance direction. The two conductive layer rows 270 align in the scanning direction. Each of the conductive layer rows 270 is formed from the plurality of conductive layers 260 aligning in the conveyance direction at the arrayal pitch P. In the two conductive layer rows 270, the conductive layers 260 deviate in position along the conveyance direction by half of the arrayal pitch P of the respective conductive layer rows 270 (P/2). Note that each conductive layer 260 is not in contact with another conductive layer 260 and the intermediate common electrode 241 but is electrically separated therefrom.

Likewise, (1) between the plurality of projecting portions 245 projecting in the scanning direction from the second extending portion 244 from the left toward the end portions 240R, and the plurality of projecting portions 245 projecting in the scanning direction from the third extending portion 244 from the left toward the end portions 240L, (2) between the plurality of projecting portions 245 projecting in the scanning direction from the third extending portion 244 from the left toward the end portions 240R, and the plurality of projecting portions 245 projecting in the scanning direction from the fourth extending portion 244 from the left toward the end portions 240L, (3) between the plurality of projecting portions 245 projecting in the scanning direction from the fourth extending portion 244 from the left toward the end portions 240R, and the plurality of projecting portions 245 projecting in the scanning direction from the fifth extending portion 244 from the left toward the end portions 240L, (4) between the plurality of projecting portions 245 projecting in the scanning direction from the fifth extending portion 244 from the left toward the end portions 240R, and the plurality of projecting portions 245 projecting in the scanning direction from the sixth extending portion 244 from the left toward the end portions 240L, (5) between the plurality of projecting portions 245 projecting in the scanning direction from extending portion 243 toward the end portions 240R, and the plurality of projecting portions 245 projecting in the scanning direction from the first extending portion 244 from the left toward the end portions 240L, too, two conductive layer rows 270 are arranged, respectively. Further, between the plurality of projecting portions 245 projecting in the scanning direction from the sixth extending portion 244 from the left toward the end portions 240R, and the end portions 240R of the intermediate piezoelectric layer 240, one conductive layer row 270 is arranged.

The respective conductive layers 260 have an approximately square shape. As depicted in FIG. 8A, each of the respective conductive layers 260 is almost the same in side length as the width of the narrow portions 143 along the conveyance direction, but smaller than the width of the narrow portions 143 along the scanning direction. The respective conductive layers 260 are arranged adjacent to one of the projecting portions 245 along the scanning direction. Each of the conductive layers 260 has almost the same position along the conveyance direction as the adjacent one projecting portion 245 along the scanning direction. Note that the respective conductive layers 260 are arranged in positions not overlapping with the narrow portions 143 of the individual electrodes 141 along the stacking direction. Further, the respective conductive layers 260 are arranged in positions overlapping with an aftermentioned plurality of through holes 360 along the stacking direction.

<The Lower Common Electrode 341>

Figure 7:
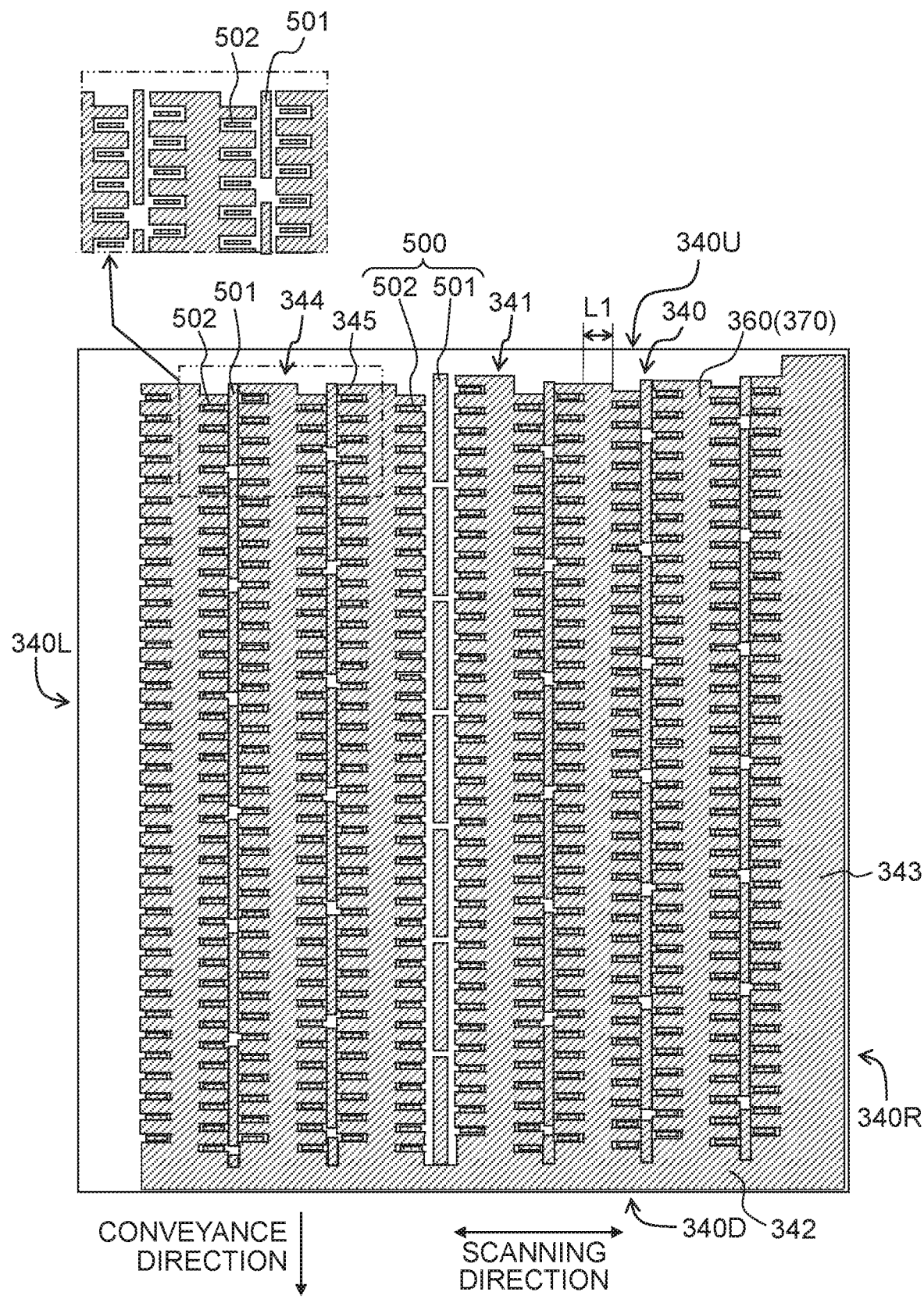
FIG. 7 is a top view of a lower piezoelectric layer 340.

As depicted in FIGS. 4A and 4B, the lower common electrode 341 is formed on the upper surface of the lower piezoelectric layer 340. As depicted in FIG. 7, the lower common electrode 341 has an extending portion 342 extending along the scanning direction (the left/right direction) to cover the end portion 340D of the lower piezoelectric layer 340 along the conveyance direction, an extending portion 343 extending along the conveyance direction to cover the end portion 340R of the lower piezoelectric layer 340 along the scanning direction, six extending portions 344 extending along the conveyance direction from the extending portion 342 toward the end portion 340U of the lower piezoelectric layer 340 along the conveyance direction, and a plurality of projecting portions 345 projecting from the respective extending portions 344 to the two opposite sides along the scanning direction. Further, the plurality of projecting portions 345 also project from the extending portion 343 toward the end portion 340L of the lower piezoelectric layer 340 along the scanning direction. Note that the extending portion 342 is positioned not to overlap with the pressure chambers 26 and the individual electrodes 141 in the stacking direction. Further, in the stacking direction, the extending portion 342 does not overlap with the intermediate common electrode 241 either.

The six extending portions 344 extend in the conveyance direction between the wide portions 142 of the individual electrodes 141 forming two adjacent individual electrode arrays 150 along the scanning direction, not overlapping with the wide portions 142 of the individual electrodes 141 forming the individual electrode arrays 150 along the stacking direction, respectively. In FIG. 6, among the six extending portions 344, the first extending portion 344 from the left extends in the conveyance direction to pass through between the wide portions 142 forming the first and second individual electrode arrays 150 from the left along the scanning direction. The second extending portion 344 from the left extends in the conveyance direction to pass through between the wide portions 142 forming the third and fourth individual electrode arrays 150 from the left along the scanning direction. The third extending portion 344 from the left extends in the conveyance direction to pass through between the wide portions 142 forming the fifth and sixth individual electrode arrays 150 from the left along the scanning direction. The fourth extending portion 344 from the left extends in the conveyance direction to pass through between the dummy electrodes 171 forming the dummy electrode array 170 and the wide portions 142 forming the seventh individual electrode array 150 from the left along the scanning direction. The fifth extending portion 344 from the left extends in the conveyance direction to pass through between the wide portions 142 forming the eighth and ninth individual electrode arrays 150 from the left along the scanning direction. The sixth extending portion 344 from the left extends in the conveyance direction to pass through between the wide portions 142 forming the tenth and eleventh individual electrode arrays 150 from the left along the scanning direction.

Note that the fourth extending portion 344 from the left is positioned at the boundary between the pressure chamber rows 25 for the color inks and the pressure chamber rows 25 for the black ink. The six extending portions 344 have the same width. With respect to the five extending portions 344 not including the fourth extending portion 344 from the left, the individual electrodes 141 forming two individual electrode arrays 150 interposing each extending portion 344 along the scanning direction are arranged to let the narrow portions 143 face each other along the scanning direction (see FIG. 5). That is, with respect to the five extending portions 344 not including the fourth extending portion 344 from the left, the interval, along the scanning direction, of the wide portions 142 of the individual electrodes 141, is L1, the individual electrodes 141 forming two individual electrode arrays 150 interposing each extending portion 344 along the scanning direction. Further, the interval, along the scanning direction, between the dummy electrodes 171 forming the dummy electrode array 170 and the wide portions 142 of the individual electrodes 141 forming the seventh individual electrode array 150 from the left, interposing the fourth extending portion 344 from the left, also is L1. In addition, the width of the six extending portions 344 along the scanning direction also is L1.

Figure 8B:
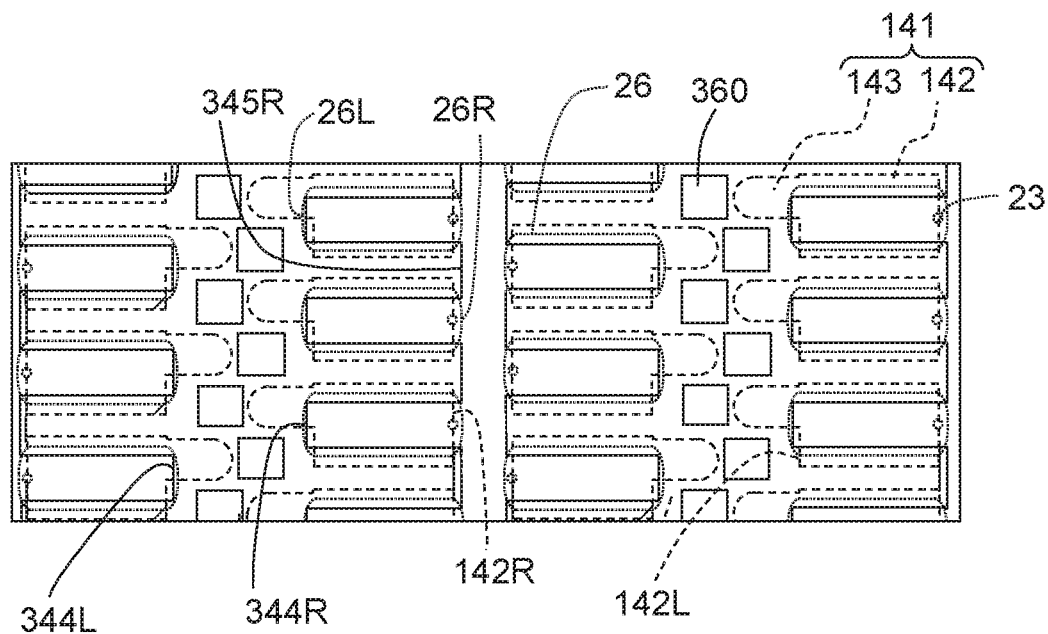
FIG. 8B is a schematic view showing an overlap between the upper piezoelectric layer 140 and the lower piezoelectric layer 340.
Figure 9A:
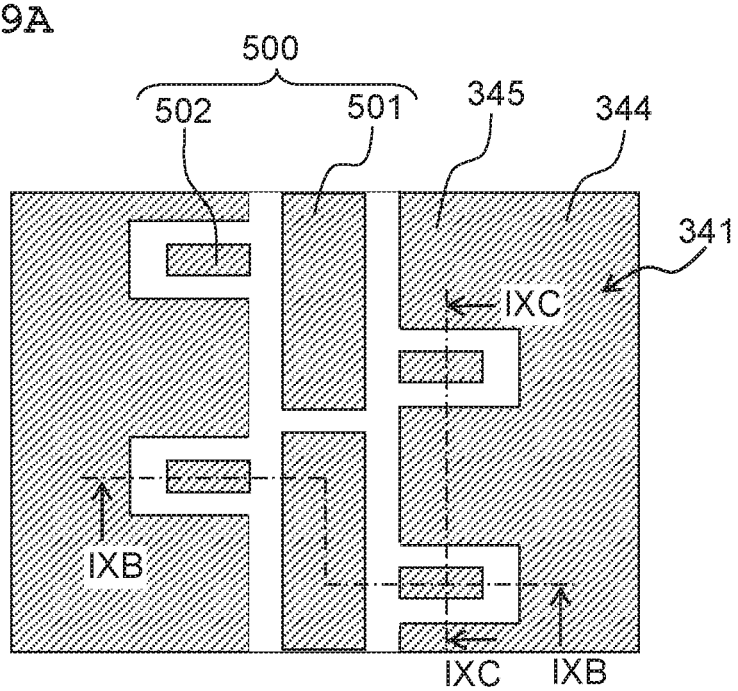
FIG. 9A is a top view of the lower piezoelectric layer 340.
Figure 9B:
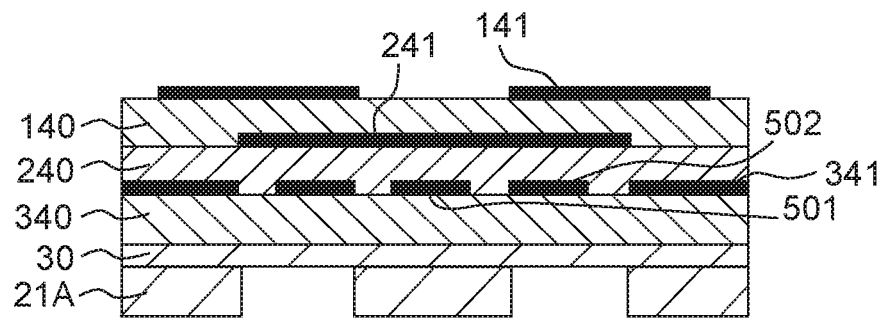
FIGS. 9B and 9C are cross-sectional views of the lower piezoelectric layer 340.
Figure 9C:
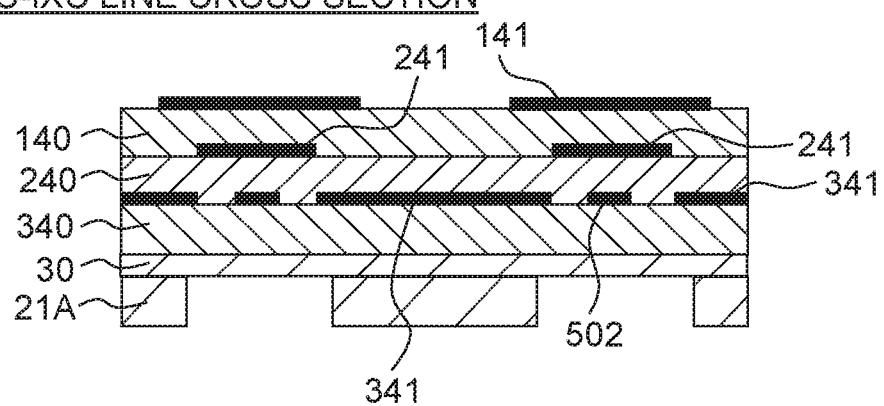

Next, referring to FIG. 8B, an explanation will be made about a positional relation between the pressure chambers 26, the individual electrodes 141, and the lower common electrode 341. In FIG. 8B, the four individual electrode arrays aligning in the scanning direction are depicted but, here with FIG. 8B, the explanation will be made about the positional relation by taking as an example the individual electrodes 141 included in the second individual electrode array from the left, and the pressure chambers 26 and lower common electrode 341 overlapping therewith along the stacking direction. In order to see the figure easily, solid lines are used to show the lower common electrode 341 and the through holes 360 formed in the lower piezoelectric layer 340, while dotted lines are used to show the pressure chambers 26, the individual electrodes 141, and the like.

The projecting portions 345 of the lower common electrode 341 are almost as long as the wide portions 142 of the individual electrodes 141, along the scanning direction.

The end portions 26L of the pressure chambers 26 are positioned between the end portions 344L and the end portions 344R of the extending portions 344, along the scanning direction. The end portions 26R of the pressure chambers 26 have almost the same position along the scanning direction as the end portions 345R of the projecting portions 345 of the lower common electrode 341 along the scanning direction. The end portions 344R of the extending portions 344 of the lower common electrode 341 are positioned between the end portions 26L of the pressure chambers 26 and the end portions 142L of the wide portions 142 of the individual electrodes 141, along the scanning direction.

Further, as described earlier on, the end portions 142L of the wide portions 142 have almost the same position along the scanning direction as the end portions 245L of the projecting portions 245 of the intermediate common electrode 241 along the scanning direction (see FIG. 8A). Therefore, it is understood that the projecting portions 245 of the intermediate common electrode 241 do not overlap with the extending portions 344 of the lower common electrode 341 along the stacking direction. Further, the end portions 244L of the extending portions 144 of the intermediate common electrode 241 have almost the same position along the scanning direction as the nozzles 23 (see FIG. 8A). Therefore, it is understood that the projecting portions 345 of the lower common electrode 341 do not overlap with the extending portions 244 of the intermediate common electrode 241 along the stacking direction.

The central positions, along the conveyance direction, of the projecting portions 345 of the lower common electrode 341 are almost in alignment with the central position of the interval between two adjacent pressure chambers 26 along the conveyance direction. The interval between two adjacent pressure chambers 26 along the conveyance direction is shorter than the projecting portions 345 of the lower common electrode 341 along the conveyance direction. Therefore, two opposite end portions of the pressure chambers 26 along the conveyance direction overlap with the projecting portions 345 of the lower common electrode 341, along the stacking direction. Note that the overlapping parts between the pressure chambers 26 and the projecting portions 345 of the lower common electrode 341 along the stacking direction are shorter than ¼ of the pressure chambers 26, along the conveyance direction. As described above, in the two opposite end portions of the pressure chambers 26 along the conveyance direction, about ¼ of the pressure chambers 26 in the length along the conveyance direction do not overlap with the projecting portions 245 of the intermediate common electrode 241 along the stacking direction. Therefore, the projecting portions 345 of the lower common electrode 341 do not overlap with the projecting portions 245 of the intermediate common electrode 241 along the stacking direction.

Note that as described earlier on, the central positions, along the conveyance direction, of the pressure chambers 26 are almost in alignment with the central positions of the wide portions 142 of the individual electrodes 141 along the conveyance direction and, the wide portions 142 of the individual electrodes 141 are longer than the pressure chambers 26, along the conveyance direction. Therefore, the two opposite end portions of the wide portions 142 overlap with the projecting portions 345 of the lower common electrode 341, along the stacking direction. The overlapped parts between the wide portions 142 and the projecting portions 345 of the lower common electrode 341 along the stacking direction are longer than the overlapped parts between pressure chambers 26 and the projecting portions 345 of the lower common electrode 341, along the conveyance direction.

<Through Holes 360>

As depicted in FIG. 7, the six extending portions 344 are formed with two through hole rows 370 extending in the conveyance direction. The two through hole rows 370 align in the scanning direction. Each of the through hole rows 370 is formed from a plurality of through holes 360 aligning at the arrayal pitch P along the conveyance direction. In the two through hole rows 370, the through holes 360 deviate in position along the conveyance direction by half of the arrayal pitch (P/2) of the respective through hole rows 370.

Each of the through holes 360 has an approximately square shape in planar view. As depicted in FIG. 8B, each of the respective through holes 360 is almost the same in side length as the narrow portions 143 in length along the conveyance direction, but smaller than the narrow portions 143 in length along the scanning direction. Further, each of the respective through holes 360 is smaller in side length than the width of the projecting portions 345 along the conveyance direction. The respective through holes 360 are arranged adjacent to one of the projecting portions 345 along the scanning direction, such that each of the through holes 360 has almost the same position along the conveyance direction as the adjacent one projecting portion 345 along the scanning direction. Note that the respective through holes 360 are arranged in positions not overlapping with the narrow portions 143 of the individual electrodes 141 along the stacking direction. Further, the respective through holes 360 are arranged in positions overlapping with the plurality of conductive layers 260 along the stacking direction.

As depicted in FIG. 8B, the intervals along the scanning direction between the respective through holes 360, and the narrow portions 143 of the individual electrodes 141 adjacent to the through holes 360 along the scanning direction are smaller than the intervals along the conveyance direction between he respective through holes 360, and the narrow portions 143 of the individual electrodes 141 adjacent to the through holes 360 along the conveyance direction.

<The Wiring Member 50>

As depicted in FIG. 2, the wiring member 50 includes a flexible printed circuit 51 (FPC 51), and the driver IC 52 arranged on the FPC 51. The flexible printed circuit 51 is formed with undepicted contact points connected electrically to undepicted bumps provided on the narrow portions 143 of the respective individual electrodes 141, such that it is possible to set a potential individually for the respective individual electrodes 141. Further, as described earlier on, the driver IC 52 can set a predetermined constant potential for the intermediate common electrode 241 and the lower common electrode 341.

<Driving of Piezoelectric Elements 401>

As described earlier on, the piezoelectric body 40 is a plate-like member of an approximately rectangular shape in planar view, arranged on the vibration plate 30 to cover the plurality of pressure chambers 26 (see FIG. 2, for example). The piezoelectric body 40 is formed with a plurality of piezoelectric elements 401 provided to correspond respectively to the plurality of pressure chambers 26. Hereinbelow, driving of the piezoelectric elements 401 will be explained. Such parts of the upper piezoelectric layer 140 as interposed between the individual electrodes 141 and the intermediate common electrode 241 along the stacking direction are polarized in the stacking direction (to be referred to below as first active portions 41 (see FIGS. 4A and 4B)). Further, such parts of the upper piezoelectric layer 140 and the intermediate piezoelectric layer 240 as interposed between the individual electrodes 141 and the lower common electrode 341 along the stacking direction are also polarized in the stacking direction (to be referred to below as second active portions 42 (see FIGS. 4A and 4B)). Here, with the driver IC 52 being powered, a predetermined first potential (24V, for example) is applied constantly to the intermediate common electrode 241, while a predetermined second potential (0V, for example) is applied constantly to the lower common electrode 341. Further, the first potential and the second potential are selectively applied to the respective individual electrodes 141. In particular, when the ink is not jetted from the pressure chamber 26 corresponding to a certain individual electrode 141, the second potential is applied to the individual electrode 141. On this occasion, because there is no potential difference between the individual electrode 141 and the lower common electrode 341, the second active portion 42 does not deform. However, between the individual electrode 141 and the intermediate common electrode 241, there is a potential difference (24V in this case). By virtue of this, the first active portion 41 deforms to project downward (toward pressure chamber 26).

When the ink is jetted from the pressure chamber 26 corresponding to a certain individual electrode 141, the first potential is first applied to the individual electrode 141 which is then returned to the second potential. That is, a pulse voltage signal is applied to the individual electrode 141 to let the same be up to the first potential from the second potential and return to the second potential after the passage of a predetermined time. When the first potential is applied to the individual electrode 141, because there is no longer any potential difference between the individual electrode 141 and the intermediate common electrode 241, the first active portion 41 is recovering from being deformed to project downward (toward the pressure chamber 26). On this occasion, because the first active portion 41 displaces upward, the pressure chamber 26 increases in volume. At this time, a potential difference (24V in this case) comes about between the individual electrode 141 and the lower common electrode 341 such that the second active portion 42 deforms to raise a central portion of the pressure chamber 26, thereby enabling the pressure chamber 26 to increase in volume. Next, if the potential of the individual electrode 141 returns from the first potential to the second potential, as described above, because there is no longer any potential difference between the individual electrode 141 and the lower common electrode 341, although the second active portion 42 recovers to its original state, the potential difference (24V in this case) from the first potential to the second potential comes about again between the individual electrode 141 and the intermediate common electrode 241. By virtue of this, the first active portion 41 deforms to project downward (toward the pressure chamber 26). On this occasion, due to the pressure applied on the pressure chamber 26, the ink inside the pressure chamber 26 is jetted from the nozzle 23.

<About Some Large Warpage of the Piezoelectric Layer>

Figure 12A:
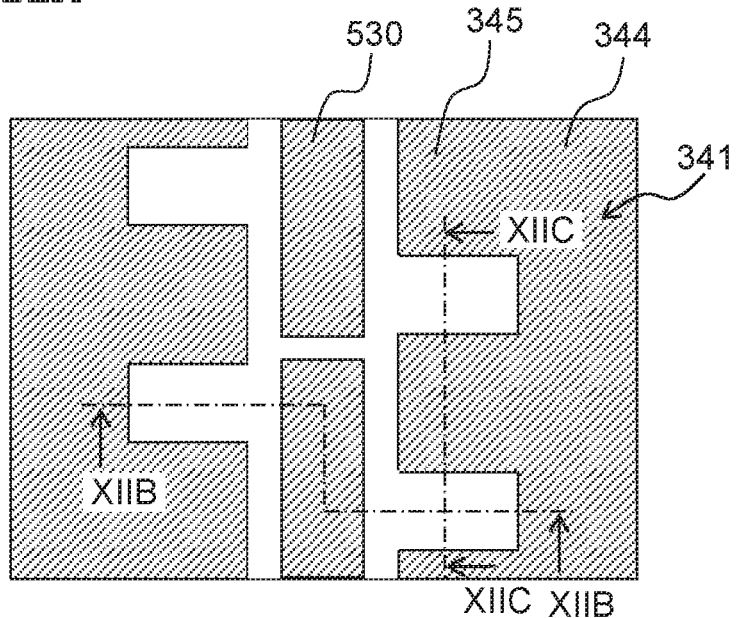
FIG. 12A is a top view of the lower piezoelectric layer 340.
Figure 12B:
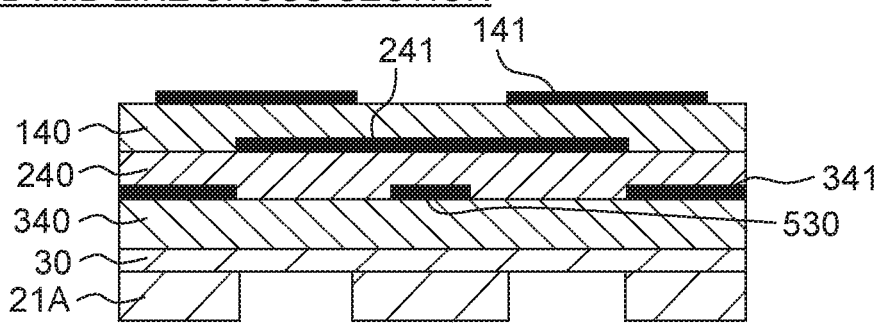
FIGS. 12B and 12C are cross-sectional views of the lower piezoelectric layer 340.
Figure 12C:
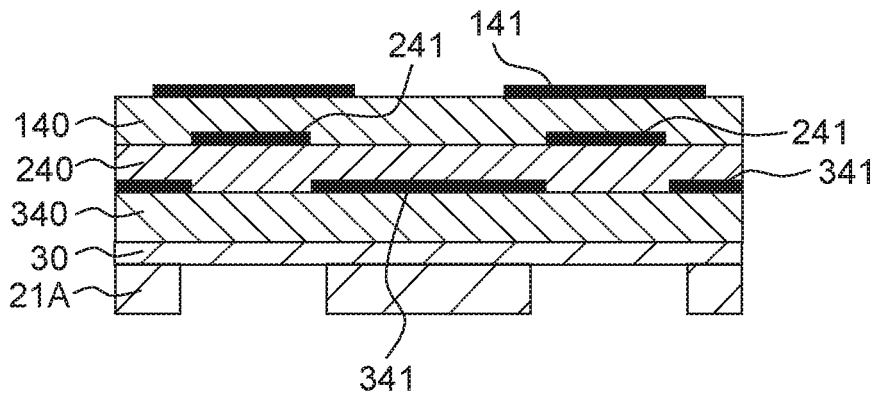
Figure 13A:
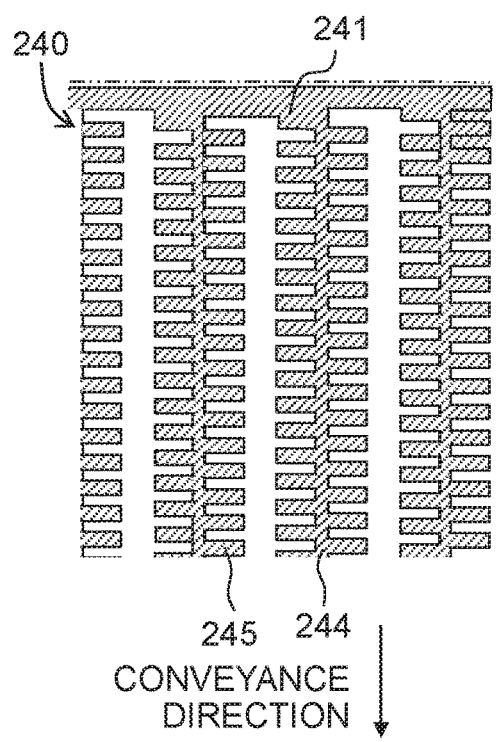
FIGS. 13A to 13C are schematic views for explaining a large warpage deformation occurring in the ink jet head.
Figure 13B:
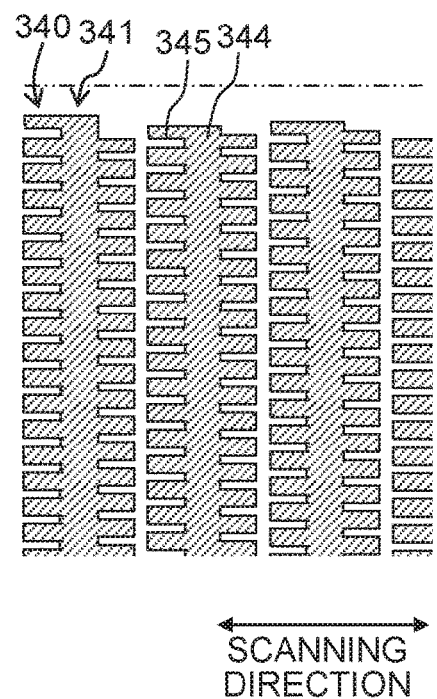
Figure 13C:
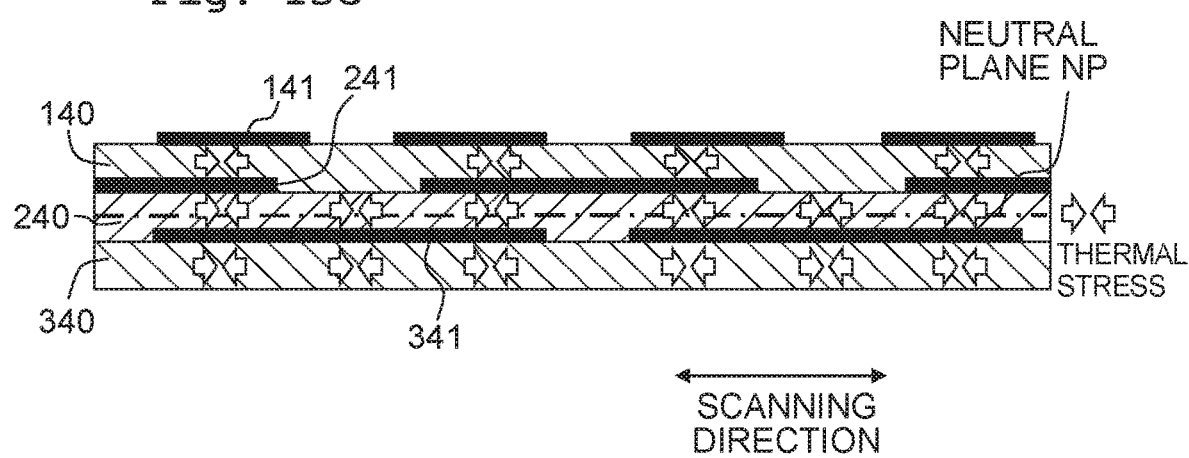

As depicted in FIG. 12C, consider a case where the conductive layers 260 are not formed on the upper surface of the intermediate piezoelectric layer 240 and, furthermore, a conductive layer 500 is not formed on the lower piezoelectric layer 340. A neutral plane NP of the piezoelectric body 40 is positioned inside the intermediate piezoelectric layer 240 along the stacking direction. In the stacking direction, the intermediate common electrode 241 and the individual electrodes 141 are arranged above the neutral plane NP whereas the lower common electrode 341 is arranged below the neutral plane NP.

Generally, when a thin metallic layer is formed such as the individual electrodes, the intermediate common electrode and the lower common electrode layer on a surface of the piezoelectric layer, the thin metallic layer is formed on a piezoelectric material sheet by way of printing or the like, and then calcined. As depicted in FIG. 12C, there is a residual thermal stress along the contraction direction in the calcined piezoelectric layer. In the following explanation, the residual thermal stress in the calcined piezoelectric layer will be simply referred to as the residual stress. The larger the area of the thin metallic layer, the stronger the residual stress. If there is a difference in magnitude between the upper residual stress and the lower residual stress across the neutral plane NP along the stacking direction, then according to the difference of those residual stresses, the piezoelectric body 40 deforms to warp in the stacking direction. In this specification, such a warpage of the piezoelectric body 40 in the stacking direction is called large warpage.

Note that if there are non-dense parts and dense parts of the thin metallic layer formed on the surface of the piezoelectric layer, then there is a difference in magnitude between those parts. Therefore, it is known that a wavelike undulation (heave) arises in the calcined piezoelectric layer. Especially, if the non-dense parts and the dense parts of the thin metallic layer align in a certain direction, then it is conceivable that in the certain direction, the undulation of the piezoelectric layer will explicitly appear. In this specification, such wavelike undulation of the piezoelectric layer is called wavy warpage to distinguish from the aforementioned large warpage.

With the upper and lower thin metallic layers are formed across the neutral plane NP along the stacking direction, if the distance along the stacking direction between each thin metallic layer and the neutral plane NP is almost the same, then whether the piezoelectric body warps upward or downward is determined according to the magnitude relation between the area of the thin metallic layer over the neutral plane NP and the area of the thin metallic layer under the neutral plane NP. The larger the area of the thin metallic layer, the greater the residual stress; therefore, if the thin metallic layer over the neutral plane NP has a larger area than the thin metallic layer under the neutral plane NP, then a large warpage will arise in the piezoelectric body which thereby projects downward. Conversely, if the thin metallic layer under the neutral plane NP has a larger area than the thin metallic layer over the neutral plane NP, then a large warpage will arise in the piezoelectric body which thereby projects upward.

With the upper and lower thin metallic layers are formed across the neutral plane NP along the stacking direction, if the distance along the stacking direction between each thin metallic layer and the neutral plane NP is different, then whether the piezoelectric body warps upward or downward is determined according to the magnitude relation between the product of the area of the thin metallic layer over the neutral plane NP and the distance from the neutral plane NP to the thin metallic layer over the neutral plane NP, and the product of the area of the thin metallic layer under the neutral plane NP and the distance from the neutral plane NP to the thin metallic layer under the neutral plane NP.

As depicted in FIG. 12C, the lower common electrode 341 is provided under the neutral plane NP while the intermediate common electrode 241 and the individual electrode 141 are provided over the neutral plane NP. Let SL be the area of the lower common electrode 341, and DL be the distance from the neutral plane NP to the lower common electrode 341 along the stacking direction. Let SC be the area of the intermediate common electrode 241, and DC be the distance from the neutral plane NP to the intermediate common electrode 241 along the stacking direction. Let SU be the area of the individual electrode 141, and DU be the distance from the neutral plane NP to the individual electrode 141 along the stacking direction.

In this embodiment, the distance DL from the neutral plane NP to the lower common electrode 341 along the stacking direction is almost the same as the distance DC from the neutral plane NP to the intermediate common electrode 241 along the stacking direction. On the other hand, the area SL of the lower common electrode 341 is larger than the area SC of the intermediate common electrode 241. Therefore, if the product SL×DL is compared to the product SC×DC, then SL×DL>SC×DC holds. However, because the distance DU from the neutral plane NP to the individual electrode 141 along the stacking direction is larger than the distance DL and larger than the distance DC, the product SU×DU is larger. Therefore, it follows that SL×DL<SC×DC+SU×DU whereby a large warpage arises in the piezoelectric body 40 which thereby projects downward.

In this embodiment, the conductive layer 500 is formed on the upper surface of the lower piezoelectric layer 340 formed with the lower common electrode 341. If SE is the area of the conductive layer 500, then the left side of the above relational expression is SL×DL+SE×DL. Further, in this embodiment, too, because such a large warpage arises as to project downward, SL×DL+SE×DL<SC×DC+SU×DU is conceivable. However, compared to a case where the lower piezoelectric layer 340 is not formed with the conductive layer 500, in the case where the lower piezoelectric layer 340 is formed with the conductive layer 500, because the difference between the right side and the left side becomes smaller by the product SE×DL, it is possible to diminish the magnitude of the large warpage, at that rate, arising in the piezoelectric body 40.

Note that if the distance DC from the neutral plane NP to the intermediate common electrode 241 along the stacking direction is larger than the distance DL from the neutral plane NP to the lower common electrode 341 along the stacking direction, then even if the conductive layer 500 is provided to have the same area as in the embodiment, it is still possible to increase the product SE×DL due to the larger distance DL. Therefore, in such cases, it is especially effective to provide the conductive layer 500 as in the embodiment.

Extending portions 501 and 502 of the conductive layer 500 are printed on the surface of the lower piezoelectric layer 340 by a publicly known printing technique such as screen mesh or the like. Due to some printing friction or the like, it is possible for the extending portions 501 and 502 of the conductive layer 500 to contact with the lower common electrode 341, resulting in short-circuit. As depicted in FIGS. 8A and 8B, the extending portions 501 and 502 of the conductive layer 500 are formed in positions overlapping with the intermediate common electrode 241 along the stacking direction. Therefore, if the short-circuit occurs between the extending portions 501 and 502 of the conductive layer 500 and the lower common electrode 341, then a potential difference will arise between the same and the intermediate common electrode 241 overlapping therewith along the stacking direction, thereby being liable to cause some jet defects and the like. In this embodiment, however, the plurality of extending portions 501 and the plurality of extending portions 502 of the conductive layer 500 are formed away from each other so as not to have contacts. Therefore, even if the short-circuit occurs between some of the extending portions 501 and 502 of the conductive layer 500 and the lower common electrode 341, no effect will be exerted to the other extending portions 501 and 502 of the conductive layer 500.

In this embodiment, the extending portions 501 of the conductive layer 500 align in rows in the conveyance direction and, between two adjacent extending portions 501 along the conveyance direction, an interval is provided. Therefore, between the part of the lower piezoelectric layers 340 provided with the extending portions 501 of the conductive layer 500 and the part provided with the above interval, the residual stress differs in magnitude. Therefore, because of that, the piezoelectric body 40 deforms slightly such that variation in density is liable to arise during a print. However, in this embodiment, the above interval along the conveyance direction is set at a position which differs in each row of the extending portions 501 being different along the scanning direction. Therefore, even if such variation in density arise as described above, because of its misalignment along the conveyance direction, it is possible to make the variation in density inexplicit.

Modified Embodiments

Figure 10A:
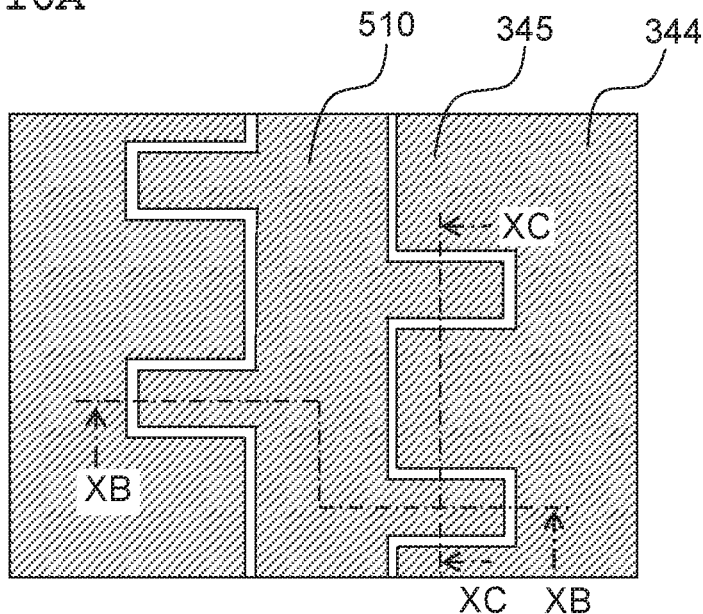
FIG. 10A is another top view of the lower piezoelectric layer 340.
Figure 10B:
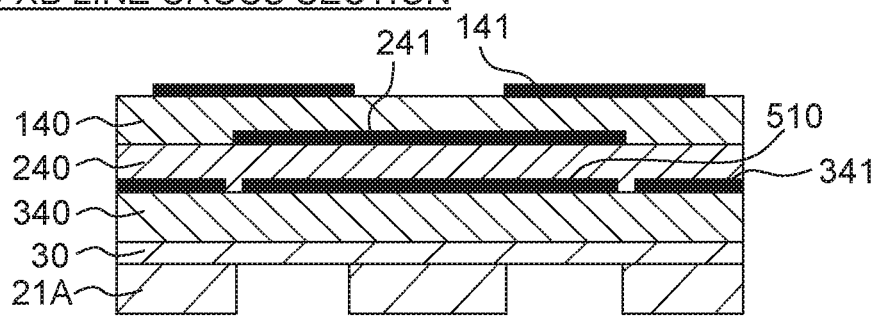
FIGS. 10B and 10C are other cross-sectional views of the lower piezoelectric layer 340.
Figure 10C:
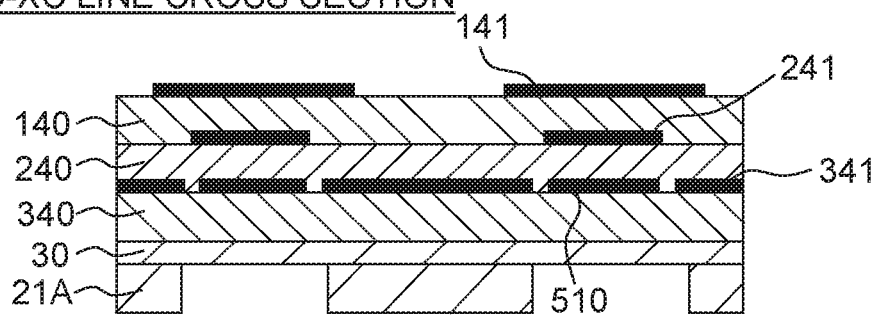

The shape and the like of the conductive layer 500 are not limited to above embodiment but it is possible to apply various changes and modifications thereto. For example, as depicted in FIGS. 10A to 10C, it is possible to form one conductive layer 510 in such a part of the lower piezoelectric layer 340 as between two adjacent extending portions 344 along the scanning direction. The conductive layer 510 is formed to almost infill the part of the lower piezoelectric layer 340 between the two adjacent extending portions 344 along the scanning direction. Further, only a small space of interval is formed between the conductive layer 510 and the lower common electrode 341 for noncontact between the conductive layer 510 and the lower common electrode 341. As depicted in FIGS. 10A to 10C, the conductive layer 510 almost overlaps with the intermediate common electrode 241 along the stacking direction.

As described earlier on, because the conductive layer 510 almost infills the part of the lower piezoelectric layer 340 between every two adjacent extending portions 344 along the scanning direction, it is possible to increase the area SE of the conductive layer 510. Therefore, on the left side (SL×DL+SE×DL) of the aforementioned relational expression, it is possible to increase the second term SE×DL. Hence, it is possible to reduce the difference between the right side (SC×DC+SU×DU) and the left side (SL×DL+SE×DL) of the aforementioned relational expression, thereby allowing suppression of the magnitude of the large warpage arising in the piezoelectric body 40.

However, due to some printing friction or the like, if there is a short-circuit between the conductive layer 510 and the lower common electrode 341, then a potential difference will arise between the conductive layer 510 and the intermediate common electrode 241 to cause jet defects. As described earlier on, the conductive layer 510 has a large area and, on top of that, almost overlaps with the intermediate common electrode 241 along the stacking direction such that once the sort-circuit happens between the conductive layer 510 and the lower common electrode 341, a wide range of jet defects are subject to occurrence.

Figure 11A:
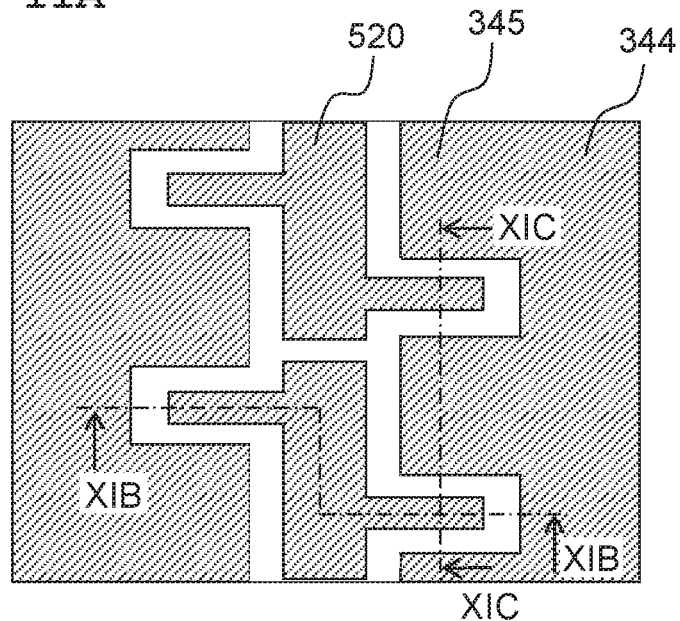
FIG. 11A is a top view of the lower piezoelectric layer 340.
Figure 11B:
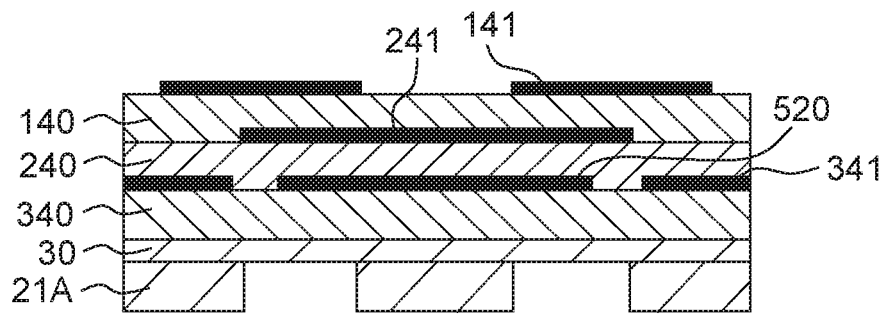
FIGS. 11B and 11C are cross-sectional views of the lower piezoelectric layer 340.
Figure 11C:
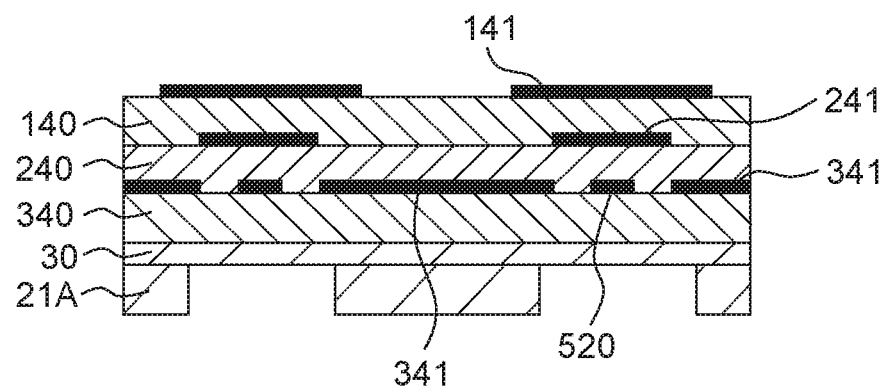

As depicted in FIGS. 11A to 11C, a plurality of conductive layers 520 correspond to letting the extending portions 502 extend toward the extending portions 501 to render contacts between the extending portions 501 of the conductive layer 500 in the above embodiment and the extending portions 502 adjacent thereto along the stacking direction. In contrast to the conductive layer 500 of the above embodiment, no interval is formed between the extending portions 501 and the extending portions 502; therefore, at that rate, it is possible to make the area of the conductive layers 520 larger than the area of the conductive layer 500. By increasing the area SE of the conductive layer, it is possible to increase the second term SE×DL on the left side (SL×DL+SE×DL) of the aforementioned relational expression. Therefore, it is possible to reduce the difference between the right side (SC× DC+SU×DU) and the left side (SL×DL+SE×DL) of the aforementioned relational expression, thereby allowing suppression of the magnitude of the large warpage arising in the piezoelectric body 40.

Further, due to some printing friction or the like, if there is a short-circuit between the conductive layer 520 and the lower common electrode 341, then due to the larger area compared to the conductive layer 500, a wide range of jet defects are subject to occurrence. Especially, in the case of the conductive layer 500, if a short-circuit occurs between the extending portions 502 and the lower common electrode 341, then because the extending portions 502 are not in contact with the extending portions 501, no effect will be exerted to the extending portions 501. However, as described earlier on, because such intervals are not provided in the conductive layer 520 as between the extending portions 501 and the extending portions 502, once the short-circuit occurs between the conductive layer 520 and the lower common electrode 341, then compared to the case of the conductive layer 500, a wider range of jet defects are subject to occurrence.

As depicted in FIGS. 12A to 12C, a plurality of conductive layers 530 may be formed at intervals along the conveyance direction in such parts of the lower piezoelectric layer 340 as between two adjacent extending portions 344 along the scanning direction. Each of the conductive layers 530 has an approximately rectangular planar shape elongated in the conveyance direction. The position and shape of each conductive layer 530 are the same as those of the extending portions 501 of the conductive layer 500 in the above embodiment. Note that differing from the conductive layer 500 of the above embodiment, the conductive layers 530 in this modified embodiment do not have the parts corresponding to the extending portions 502.

In the conductive layers 530 of this modified embodiment, because there are no parts corresponding to the extending portions 502 of the above embodiment, the effect of suppressing the magnitude of the large warpage arising in the piezoelectric body 40 becomes smaller than that of the above embodiment. However, because no parts are provided to correspond to the extending portions 502, it is possible to lower the risk of short-circuit between the same and the lower common electrode 341 due to such printing friction as described earlier on.

In the above embodiment, the piezoelectric body 40 has three piezoelectric layers in each of which electrodes are formed on its upper surface. However, the present teaching is not limited to such an aspect. The piezoelectric body may have three or more piezoelectric layers in each of which electrodes may be formed on its lower surface. In the above embodiment, along the stacking direction, the individual electrodes are formed uppermost, and the common electrodes (the intermediate common electrode and the lower common electrode) are provided below the individual electrodes. However, the present teaching is not limited to such an aspect. For example, along the stacking direction, the individual electrodes may be formed downmost along the stacking direction, and the common electrodes be formed above the same.

In the above embodiment, a plurality of conductive layers 260 are formed in an area of the intermediate piezoelectric layer 240 between two projecting portions 245 facing each other along the scanning direction. This results in increasing the area of the electrodes over the neutral plane NP so as to contribute to rendering a greater magnitude of the large warpage. However, because the area of the plurality of conductive layers 260 is small, it can be said that the contribution is little. In contrast to that, by providing the conductive layers 260, it is possible to reduce the non-dense parts of the thin metallic layer of the surface of the intermediate piezoelectric layer 240. By virtue of this, it is possible to reduce the wavy warpage occurring in the intermediate piezoelectric layer 240.

Note that the shape, size and position of the conductive layer 260 are not limited to the above embodiment but can be adjusted arbitrarily. Alternatively, the conductive layers 260 may not be provided on the intermediate piezoelectric layer 240.

The embodiment and the modified embodiments described above apply the present teaching to the ink jet head 5 configured to print image and the like by jetting the inks to the recording paper. In the above embodiment, the ink jet head 5 is a so-called serial ink discharge head. However, the present teaching is not limited to that but can apply to so-called line ink discharge heads. Further, the present teaching is not limited to ink discharge heads jetting ink. The present teaching is also applicable to liquid jet apparatuses used in various purposes other than printing image and the like. For example, it is possible to apply the present teaching to liquid jet apparatuses forming a conductive pattern on a substrate surface by jetting a conductive liquid onto the substrate.

What is claimed is:

1. A liquid discharge head comprising:
   a piezoelectric body including a plurality of stacked piezoelectric layers having a first end and a second end separated in a first direction orthogonal to a stacking direction of the plurality of piezoelectric layers;
   a plurality of individual electrodes located at a first plane orthogonal to the stacking direction;
   a first common electrode located at a second plane which is orthogonal to the stacking direction and different in position in the stacking direction from the first plane and different in position in the stacking direction from a neutral plane of the piezoelectric body; and
   a second common electrode located at a third plane which is orthogonal to the stacking direction and different in position in the stacking direction from the first plane and different in position in the stacking direction from the neutral plane of the piezoelectric body,
   wherein the neutral plane is positioned between the third plane and one of the first and second planes in the stacking direction,
   wherein a relation of $$D1 \times S1 + D2 \times S2 > D3 \times S3$$

is satisfied, where S1 is a sum of the areas of the plurality of individual electrodes, S2 is an area of the first common electrode, S3 is an area of the second common electrode, D1 is a distance between the neutral plane and the first plane in the stacking direction, D2 is a distance between the neutral plane and the second plane in the stacking direction, and D3 is a distance between the neutral plane and the third plane in the stacking direction,
   wherein the plurality of individual electrodes include a plurality of individual electrode arrays arranged at intervals between the first end and the second end,
   wherein the plurality of individual electrode arrays include a first individual electrode array, a second individual electrode array adjacent to the first individual electrode array in the first direction, a third individual electrode array adjacent to the second individual electrode array in the first direction, and a fourth individual electrode array adjacent to the third individual electrode array in the first direction,
   wherein the first individual electrode array is positioned between the first end and the second individual electrode array in the first direction, the second individual electrode array is positioned between the first individual electrode array and the third individual electrode array in the first direction, and the third individual electrode array is positioned between the second individual electrode array and the fourth individual electrode array in the first direction,
   wherein the plurality of individual electrodes forming the first individual electrode array are arranged in a second direction being orthogonal to the stacking direction and intersecting the first direction, the plurality of individual electrodes forming the second individual electrode array are arranged in the second direction, the plurality of individual electrodes forming the third individual electrode array are arranged along the second direction, and the plurality of individual electrodes forming the fourth individual electrode array are arranged in the second direction, wherein the second common electrode includes a first extending portion extending in the second direction to pass through between the first individual electrode array and the second individual electrode array in the first direction, a plurality of first projecting portions projecting from the first extending portion toward the second end, a second extending portion extending in the second direction to pass through between the third individual electrode array and the fourth individual electrode array along the first direction, and a plurality of second projecting portions projecting from the second extending portion toward the first end, wherein the respective first projecting portions overlap partially with one of the plurality of individual electrodes forming the second individual electrode array in the stacking direction, and the respective second projecting portions overlap partially with one of the plurality of individual electrodes forming the third individual electrode array in the stacking direction, and wherein the liquid discharge head further comprises a plurality of conductor layers which are formed on the third plane between the plurality of first projecting portions and the plurality of second projecting portions in the first direction, the plurality of conductor layers being separated from the second common electrode and being not electrically connected to the second common electrode, and the plurality of conductor layers being not electrically connected to each other.

2. The liquid discharge head according to claim 1, wherein the distance D1 is larger than the distance D3.

3. The liquid discharge head according to claim 1, wherein the neutral plane is located between the second plane and the third plane in the stacking direction.

4. The liquid discharge head according to claim 3, wherein the second plane is located between the first plane and the neutral plane in the stacking direction, and the distance D3 is larger than the distance D2.

5. The liquid discharge head according to claim 1, wherein the plurality of conductor layers includes a plurality of first conductor layer extending portions extending respectively in the second direction on the third plane between the first projecting portions and the second projecting portions in the first direction, and the plurality of first conductor layer extending portions are arranged at intervals in the second direction.

6. The liquid discharge head according to claim 5, wherein the intervals provided for the first conductor layer extending portions in the second direction are positioned not to overlap with the plurality of individual electrodes in the stacking direction.

7. The liquid discharge head according to claim 5, further comprising:
a plurality of pressure chambers arranged to overlap with the plurality of individual electrodes in the stacking direction, respectively;
a plurality of nozzles corresponding to the plurality of pressure chambers; and
a flow channel unit including a plurality of flow channels rendering respective communication between the corresponding plurality of pressure chambers and plurality of nozzles,
wherein the intervals provided for the first conductor layer extending portions in the second direction are positioned not to overlap with the plurality of pressure chambers in the stacking direction.

8. The liquid discharge head according to claim 5, wherein the plurality of first projecting portions are arranged to align at intervals in the second direction,
wherein the plurality of second projecting portions are arranged to align at intervals in the second direction;
wherein the plurality of conductor layers further include a plurality of individual conductor layers arranged in the intervals of the plurality of first projecting portions in the second direction or in the intervals of the plurality of second projecting portions in the second direction, and
wherein the plurality of individual conductor layers are provided respectively without contact with the plurality of first conductor layer extending portions.

9. The liquid discharge head according to claim 5, wherein the plurality of first projecting portions are arranged to align at intervals in the second direction,
wherein the plurality of second projecting portions are arranged to align at intervals in the second direction, and
wherein the plurality of conductor layers further have a first conductor layer projecting portion in the intervals of the plurality of first projecting portions in the second direction to project from one of the plurality of first conductor layer extending portions toward the second end, or a second conductor layer projecting portion in the intervals of the plurality of second projecting portions in the second direction to project from one of the plurality of first conductor layer extending portions toward the first end.

10. The liquid discharge head according to claim 1, wherein the plurality of individual electrode arrays include a fifth individual electrode array adjacent to the fourth individual electrode array in the first direction, and a sixth individual electrode array adjacent to the fifth individual electrode array in the first direction,
wherein the fourth individual electrode array is positioned between the third individual electrode array and the fifth individual electrode array in the first direction,
wherein the fifth individual electrode array is positioned between the fourth individual electrode array and the sixth individual electrode array along the first direction,
wherein the first common electrode includes a plurality of third projecting portions projecting from the second extending portion toward the second end, a third extending portion extending in the second direction to pass through between the fifth individual electrode array and the sixth individual electrode array in the first direction, and a plurality of fourth projecting portions projecting from the third extending portion toward the first end,
wherein the respective third projecting portions overlap partially with one of the plurality of individual electrodes forming the fourth individual electrode array in the stacking direction,
wherein the respective fourth projecting portions overlap partially with one of the plurality of individual electrodes forming the fifth individual electrode array in the stacking direction,
wherein the plurality of conductor layers includes a plurality of second conductor layer extending portions extending respectively in the second direction on the second plane between the third projecting portions and the fourth projecting portions in the first direction,
wherein the plurality of second conductor layer extending portions are aligned at intervals in the second direction, and wherein the plurality of first conductor layer extending portions differ in position of the intervals in the second direction from the plurality of second conductor layer extending portions in position of the intervals in the second direction.

11. A liquid discharge head comprising:
a piezoelectric body including a plurality of stacked piezoelectric layers having a first end and a second end separated in a first direction orthogonal to a stacking direction of the plurality of piezoelectric layers;
a plurality of individual electrodes located at a first plane orthogonal to the stacking direction;
a first common electrode located at a second plane which is orthogonal to the stacking direction and different in position in the stacking direction from the first plane and different in position in the stacking direction from a neutral plane of the piezoelectric body; and
a second common electrode located at a third plane which is orthogonal to the stacking direction and different in position along the stacking direction from the first plane and different in position in the stacking direction from the neutral plane of the piezoelectric body,
wherein the neutral plane is positioned between the third plane and one of the first and second planes in the stacking direction;
wherein a relation of $$D1 \times S1 + D2 \times S2 > D3 \times S3$$

is satisfied; where S1 is a sum of the areas of the plurality of individual electrodes, S2 is an area of the first common electrode, S3 is an area of the second common electrode, D1 is a distance between the neutral plane and the first plane in the stacking direction, D2 is a distance between the neutral plane and the second plane in the stacking direction, and D3 is a distance between the neutral plane and the third plane in the stacking direction,
wherein the plurality of individual electrodes form a plurality of individual electrode arrays arranged at intervals between the first end and the second end;
wherein the plurality of individual electrode arrays include a first individual electrode array, a second individual electrode array adjacent to the first individual electrode array in the first direction, a third individual electrode array adjacent to the second individual electrode array in the first direction, and a fourth individual electrode array adjacent to the third individual electrode array in the first direction;
wherein the first individual electrode array is positioned between the first end and the second individual electrode array in the first direction, the second individual electrode array is positioned between the first individual electrode array and the third individual electrode array in the first direction, and the third individual electrode array is positioned between the second individual electrode array and the fourth individual electrode array in the first direction;
wherein the plurality of individual electrodes forming the first individual electrode array are arranged in a second direction being orthogonal to the stacking direction and intersecting the first direction, the plurality of individual electrodes forming the second individual electrode array are arranged along the second direction, the plurality of individual electrodes forming the third individual electrode array are arranged in the second direction, and the plurality of individual electrodes forming the fourth individual electrode array are arranged in the second direction,
wherein the second common electrode includes a first extending portion extending in the second direction to pass through between the first individual electrode array and the second individual electrode array in the first direction, a plurality of first projecting portions projecting from the first extending portion toward the second end, a second extending portion extending in the second direction to pass through between the third individual electrode array and the fourth individual electrode array along the first direction, and a plurality of second projecting portions projecting from the second extending portion toward the first end,
wherein the respective first projecting portions overlap partially with one of the plurality of individual electrodes forming the second individual electrode array in the stacking direction, and the respective second projecting portions overlap partially with one of the plurality of individual electrodes forming the third individual electrode array in the stacking direction, and
wherein the liquid discharge head further comprises a conductor layer which is formed on the third plane between the plurality of first projecting portions and the plurality of second projecting portions in the first direction, which is separated from the second common electrode and which is not electrically connected to the second common electrode.

12. The liquid discharge head according to claim 11, wherein the conductor layer includes a conductor layer projecting portion projecting from the conductor layer extending portions toward the second end in the intervals of the plurality of first projecting portions in the second direction.

13. The liquid discharge head according to claim 1, further comprising:
a plurality of pressure chambers arranged to overlap with the plurality of individual electrodes in the stacking direction;
a plurality of nozzles corresponding to the plurality of pressure chambers; and
a flow channel unit including a plurality of flow channels rending respective communication between the corresponding plurality of pressure chambers and plurality of nozzles.

14. The liquid discharge head according to claim 11, further comprising:
a plurality of pressure chambers arranged to overlap with the plurality of individual electrodes in the stacking direction;
a plurality of nozzles corresponding to the plurality of pressure chambers; and
a flow channel unit including a plurality of flow channels rending respective communication between the corresponding plurality of pressure chambers and plurality of nozzles.

15. The liquid discharge head according to claim 1, wherein the piezoelectric body includes a plurality of first active portions which is sandwiched between the plurality of individual electrodes and the first common electrodes in the stacking direction and a plurality of second active portions sandwiched between the plurality of individual electrodes and the second common electrodes in the stacking direction,
wherein the first active portions is polarized by the plurality of individual electrodes and the first common electrode, and is not polarized by the conductive layer, and wherein the second active portions is polarized by the plurality of individual electrodes and the second common electrode, and is not polarized by the conductive layer.

16. The liquid discharge head according to claim 11, wherein the piezoelectric body includes a plurality of first active portions which is sandwiched between the plurality of individual electrodes and the first common electrodes in the stacking direction and a plurality of second active portions sandwiched between the plurality of individual electrodes and the second common electrodes in the stacking direction,
wherein the first active portions is polarized by the plurality of individual electrodes and the first common electrode, and is not polarized by the conductive layer, and
wherein the second active portions is polarized by the plurality of individual electrodes and the second common electrode, and is not polarized by the conductive layer.

17. A liquid discharge head comprising:
a piezoelectric body including a plurality of stacked piezoelectric layers having a first end and a second end separated in a first direction orthogonal to a stacking direction of the plurality of piezoelectric layers;
a plurality of individual electrodes located at a first plane orthogonal to the stacking direction;
a first common electrode located at a second plane which is orthogonal to the stacking direction and different in position in the stacking direction from the first plane and different in position in the stacking direction from a neutral plane of the piezoelectric body; and
a second common electrode located at a third plane which is orthogonal to the stacking direction and different in position in the stacking direction from the first plane and different in position in the stacking direction from the neutral plane of the piezoelectric body,
wherein the neutral plane is positioned between the third plane and one of the first and second planes in the stacking direction,
wherein a relation of $D1 \times S1 + D2 \times S2 > D3 \times S3$ is satisfied, where S1 is a sum of the areas of the plurality of individual electrodes, S2 is an area of the first common electrode, S3 is an area of the second common electrode, D1 is a distance between the neutral plane and the first plane in the stacking direction, D2 is a distance between the neutral plane and the second plane in the stacking direction, and D3 is a distance between the neutral plane and the third plane in the stacking direction,
wherein the plurality of individual electrodes include a plurality of individual electrode arrays arranged at intervals between the first end and the second end,
wherein the plurality of individual electrode arrays include a first individual electrode array, a second individual electrode array adjacent to the first individual electrode array in the first direction, a third individual electrode array adjacent to the second individual electrode array in the first direction, and a fourth individual electrode array adjacent to the third individual electrode array in the first direction,
wherein the first individual electrode array is positioned between the first end and the second individual electrode array in the first direction, the second individual electrode array is positioned between the first individual electrode array and the third individual electrode array in the first direction, and the third individual electrode array is positioned between the second individual electrode array and the fourth individual electrode array in the first direction,
wherein the plurality of individual electrodes forming the first individual electrode array are arranged in a second direction being orthogonal to the stacking direction and intersecting the first direction, the plurality of individual electrodes forming the second individual electrode array are arranged in the second direction, the plurality of individual electrodes forming the third individual electrode array are arranged along the second direction, and the plurality of individual electrodes forming the fourth individual electrode array are arranged in the second direction,
wherein the second common electrode includes a first extending portion extending in the second direction to pass through between the first individual electrode array and the second individual electrode array in the first direction, a plurality of first projecting portions projecting from the first extending portion toward the second end, a second extending portion extending in the second direction to pass through between the third individual electrode array and the fourth individual electrode array along the first direction, and a plurality of second projecting portions projecting from the second extending portion toward the first end,
wherein the respective first projecting portions overlap partially with one of the plurality of individual electrodes forming the second individual electrode array in the stacking direction, and the respective second projecting portions overlap partially with one of the plurality of individual electrodes forming the third individual electrode array in the stacking direction,
wherein the liquid discharge head further comprises a plurality of conductor layers which are formed on the third plane between the plurality of first projecting portions and the plurality of second projecting portions in the first direction, without contact with the second common electrode and without contact with each other,
wherein the plurality of conductor layers includes a plurality of first conductor layer extending portions extending respectively in the second direction on the third plane between the first projecting portions and the second projecting portions in the first direction, and the plurality of first conductor layer extending portions are arranged at intervals in the second direction, and
wherein the intervals provided for the first conductor layer extending portions in the second direction are positioned not to overlap with the plurality of individual electrodes in the stacking direction.

* * * * *